US010729029B2

(12) United States Patent
Logan et al.

(10) Patent No.: US 10,729,029 B2
(45) Date of Patent: Jul. 28, 2020

(54) MOUNTING AND COMPONENT HOLDER APPARATUSES AND ASSEMBLIES FOR HOLDING RIGID COMPONENTS

(71) Applicant: EVOLUTION ENGINEERING INC., Calgary, Alberta (CA)

(72) Inventors: Aaron W. Logan, Calgary (CA); Jili Liu, Calgary (CA); David A. Switzer, Calgary (CA); Justin C. Logan, Calgary (CA)

(73) Assignee: EVOLUTION ENGINEERING INC., Calgary (CA)

( * ) Notice: Subject to any disclaimer, the term of this patent is extended or adjusted under 35 U.S.C. 154(b) by 465 days.

(21) Appl. No.: 15/480,253

(22) Filed: Apr. 5, 2017

(65) Prior Publication Data

US 2017/0208701 A1    Jul. 20, 2017

Related U.S. Application Data

(63) Continuation of application No. 14/648,827, filed as application No. PCT/CA2012/001126 on Dec. 6, 2012, now Pat. No. 9,644,471.

(51) Int. Cl.
*H05K 7/14* (2006.01)
*E21B 47/01* (2012.01)

(52) U.S. Cl.
CPC ......... *H05K 7/1417* (2013.01); *H05K 7/1434* (2013.01); *E21B 47/01* (2013.01)

(58) Field of Classification Search
CPC ..... E21B 47/01; H05K 7/1417; H05K 7/1434
See application file for complete search history.

(56) References Cited

U.S. PATENT DOCUMENTS

| | | |
|---|---|---|
| 3,596,139 A | 7/1971 | Walsh |
| 4,400,858 A | 8/1983 | Goiffon |
| 4,479,383 A | 10/1984 | Bravenec |
| 4,547,833 A | 10/1985 | Sharp |
| 4,618,197 A | 10/1986 | White |
| 6,778,389 B1 | 8/2004 | Glovatsky |
| 6,865,085 B1 | 3/2005 | Ferris |
| 7,180,736 B2 | 2/2007 | Glovatsky et al. |
| 2009/0251871 A1 | 10/2009 | Beyer et al. |

FOREIGN PATENT DOCUMENTS

WO    2010001237    1/2010

OTHER PUBLICATIONS

PCT/CA2012/001126 International Search Report & Written Opinion dated Aug. 23, 2013.

*Primary Examiner* — D. Andrews
(74) *Attorney, Agent, or Firm* — Jeffer Mangels; Butler & Mitchell LLP; Brennan C. Swain, Esq.

(57) ABSTRACT

A component mounting apparatus for holding a rigid component in a downhole bore or a downhole collar based application includes a first body including first and second parallel spaced apart component holders disposed in a first common plane and a first support connecting the component holders together. The first and second parallel spaced apart component holders are operable to receive and grip a rigid component between the first and second parallel spaced apart component holders. Various component mounting assemblies and configurations may be realized using the component mounting apparatus described. The component mounting apparatus and various mounting assemblies may be used to mount a printed circuit board in a cylindrical enclosure or tubular housing, for example.

19 Claims, 29 Drawing Sheets

MOUNTING AND COMPONENT HOLDER APPARATUSES AND ASSEMBLIES FOR HOLDING RIGID COMPONENTS

BACKGROUND OF THE INVENTION

1. Field of Invention

This invention relates to mounting and component holder apparatuses and assemblies for holding rigid components in downhole bore or downhole collar based applications. It may be particularly advantageous to hold a circuit board for example, in a downhole bore or downhole collar assembly, and more particularly in a measurement while drilling or logging while drilling component thereof.

2. Description of Related Art

It is often necessary to hold a rigid component in a mounting or component holder apparatus or assembly such that the component is prevented from moving. This is particularly true in downhole bore assemblies where it may be necessary to mount the rigid component on an enclosure in the downhole bore assembly.

Conventional technologies for holding rigid components in a downhole bore assembly may involve extensive modification and/or milling of an enclosure to allow for the mounting of circuit boards, sensors or electronics thereupon. The rigid components may be held in situ on an outer surface of the enclosure such as by mounting screws and throughholes or they may be embedded in potting material. The circuit boards, sensors or electronics may be placed on the enclosure one after another, linearly and the enclosure may then be placed in a downhole bore assembly component. Because of the extensive milling that may be required to modify and mount the enclosures, they often need to be made of strong materials and thus the enclosures are often metallic. This makes it necessary for the enclosures to be electrically isolated from racks holding the circuit boards, sensors or electronics. In addition, the fabrication of such enclosures can be time consuming and costly. Because of the way the enclosures are customized, the orientation of the metallic racks on the enclosures may not be visually discernible. Further, because the racks are often disposed one after another, the length of the enclosure must be at least as long as the total length of the printed circuit boards disposed therein.

SUMMARY OF THE INVENTION

In accordance with one aspect of the invention, there is provided a component mounting apparatus for holding a rigid component in a downhole bore or downhole collar based application. The apparatus includes a first body including first and second parallel spaced apart component holders disposed in a first common plane and a first support connecting the component holders together. The first and second parallel spaced apart component holders are operable to receive and grip a rigid component between the first and second parallel spaced apart component holders.

The first support may have a resilient portion operable to flex to permit the first and second component holders to be moved laterally relative to each other to receive and grip the rigid component between the first and second component holders.

The first support may be spaced apart from the first common plane.

The first body may be a unitary body.

The unitary body may be formed from an electrically insulating material.

The electrically insulating material may include a thermoplastic material.

The body may be formed of an electrically conductive material.

The body may be formed by laminating, machining, casting, extruding, injection molding or stamping.

The body may be anodized.

The first and second component holders may include first and second elongated linear portions respectively.

The first and second component holders may have first and second receptacles for receiving and holding portions of the rigid component.

The apparatus may include first and second pluralities of spaced apart retainers on the first and second component holders respectively for retaining the portions of the rigid component in the first and second receptacles respectively.

The first and second pluralities of spaced apart retainers may be integrally formed in the first and second component holders respectively.

Each of the first and second component holders may have a first end portion and a second end portion.

The first and second end portions of each of the first and second component holders may extend outwardly beyond extremities of the first support.

The first end portions may have shapes complementary to the second end portions to permit the first end portions of the first and second component holders to couple with second end portions of first and second component holders of a longitudinally adjacent similar component mounting apparatus.

The support may include a hollow cylindrical enclosure within which the body is mounted.

The first body may have first and second connecting interfaces, on the first support or connected to the first support for connecting the first body to corresponding connecting interfaces of a second body of a second similar component mounting apparatus.

The first and second connecting interfaces may have first and second flat planar surfaces respectively.

The first and second flat planar surfaces may be disposed at different angles to the first common plane.

The different angles may be about +30 degrees, +45 degrees, +54 degrees, or +60 degrees and about −30 degrees, −45 degrees, −54 degrees, or −60 degrees respectively.

The different angles may be from 0 degrees to +90 degrees and from 0 degrees to −90 degrees respectively.

The first and second connecting interfaces each may have at least one open mesh.

The first and second connecting interfaces may be rigid.

The first and second connecting interfaces may be integrally formed with the first and second parallel spaced apart component holders respectively.

The apparatus may include first and second connectors on the first and second connecting interfaces respectively.

The first and second connectors may be complementary connectors.

The first and second connectors may be female and male connectors respectively.

The first support may include a connecting portion extending between the first and second connecting interfaces.

The connecting portion may be flexible and resilient.
The connecting portion may be rigid.
The connecting portion may be curved.
The connecting portion may include a central vertex.
The connecting portion may be planar.

The connecting portion may include at least one open mesh.

In accordance with another aspect of the invention, there is provided a first-level component holder assembly including the apparatus described above and a rigid component held by the first and second component holders as described above.

In accordance with another aspect of the invention, there is provided a first-level component holder assembly including a) a first apparatus as described above, b) a second apparatus as described above, and c) a rigid component having a first portion held by the first apparatus and a second portion held by the second apparatus.

In accordance with another aspect of the invention, there is provided a first-level mounting assembly including a) a first apparatus as described above, and b) a second apparatus as described above. The bodies of the first and second apparatuses are connected together at the connecting interfaces.

In accordance with another aspect of the invention, there is provided a first-level component holder assembly including a) the first-level mounting assembly as described above, and b) first and second rigid components. The first rigid component is held by the first and second component holders of the first apparatus and the second rigid component is held by the first and second holders of the second apparatus.

In accordance with another aspect of the invention, there is provided a first-level mounting assembly including a) a first apparatus including an apparatus as described above, b) a second apparatus including an apparatus as described above, and c) a third apparatus including an apparatus as described above. The first, second and third apparatuses are joined together at the connecting interfaces such that the common planes of the first, second and third apparatuses are disposed at approximately 60 degrees to each other.

Respective supports of each of the first, second and third apparatuses may each follow approximately ⅓ of an arc of a circle to define a cylindrical support structure defining a cylindrical passageway within a space defined by the common planes.

The assembly may include an inner rigid component held within the cylindrical support structure.

The inner rigid component may include an electrical, mechanical or electromechanical device.

The inner rigid component may include a capacitor or battery.

In accordance with another aspect of the invention, there is provided a first-level component holder assembly including the first-level mounting assembly as described above and further including first, second and third outer rigid components held by the first, second and third apparatuses respectively.

The first, second and third outer rigid components may include first, second and third printed circuit boards respectively.

In accordance with another aspect of the invention, there is provided a second-level component holder assembly including the first-level component holder assembly as described above and further including a first end mount for mounting the second-level component holder assembly in a hollow cylindrical enclosure.

The first end mount may include a) a first mount body having i) a surface portion configured to be coincident with an inner surface of the hollow cylindrical enclosure when the first mount body is received in the hollow cylindrical enclosure, ii) a first first-level assembly connector operably configured to connect to the first and second component holders of at least one apparatus of the second-level component holder assembly to secure the second-level component holder assembly to the first mount body, and iii) a first coupler operably configured to couple to a complementary coupler of an axially adjacent complementary mounting interface.

The first coupler may include a) a plurality of radially and axially extending protrusions, b) a plurality of arcuate surfaces between the radially and axially extending protrusions, and c) threaded openings in at least two of the arcuate surfaces for receiving respective threaded fasteners.

The first coupler may include a first end surface having a first opening.

The assembly may include a first electrical connector in the first opening.

The assembly may include a second end mount for mounting the second-level assembly in the hollow cylindrical enclosure.

The second end mount may include a) a second mount body having i) a plurality of surface portions configured to be coincident with the inner surface of the hollow cylindrical enclosure when the second mount body is received in the hollow cylindrical enclosure, ii) a second first-level assembly connector operably configured to connect to the first and second component holders of at least one apparatus of the second-level component assembly to secure the second-level component holder assembly to the second mount body, and iii) a second coupler operably configured to couple to a complementary coupler of an axially adjacent complementary mounting interface.

The second coupler may include a) a plurality of spaced apart axially extending arcuate projections disposed in spaced apart relation on a circle, and b) openings in at least two of the arcuate projections for receiving respective threaded fasteners.

The second coupler may include a second end surface having a second opening.

The assembly may include a second electrical connector in the second opening.

The first and second mount bodies may be unitary bodies formed from an electrically insulating material.

In accordance with another aspect of the invention, there is provided a third-level component holder assembly including the second-level component holder assembly as described above and further including a hollow cylindrical enclosure. The first and second couplers are mounted to the hollow cylindrical enclosure to mount the second-level component holder assembly in the hollow cylindrical enclosure.

In accordance with another aspect of the invention, there is provided a fourth-level component holder assembly including a) a first third-level component holder assembly as described above, and b) a second third-level component holder assembly as described above. The first coupler of the first third-level component holder assembly is connected to the second coupler of the second third-level component holder assembly to join together the first and second third-level component holder assemblies.

In accordance with another aspect of the invention, there is provided a component holder assembly for holding a rigid component in a downhole bore or a collar based application. The assembly includes a tubular housing having an inner wall defining an internal volume, a plurality of rigid components, and a plurality of pairs of parallel spaced apart component holders disposed in the internal volume and connected to the tubular housing, each of the plurality of pairs of component holders being disposed in a respective common plane and holding a respective one of the plurality of rigid components within the internal volume.

The above assembly may further include a plurality of holder connectors for connecting the plurality of pairs of component holders to the tubular housing.

The component holders may be integral with the tubular housing.

The common plane of each of the pairs of component holders may be disposed at an angle to the common plane of an adjacent one of the pairs of component holders.

The plurality of pairs of component holders may include three pairs of component holders and the angle may be about 60 degrees.

In accordance with another aspect of the invention, there is provided an apparatus for holding a rigid component in a downhole bore or a downhole collar based application. The apparatus includes a first support, first and second connecting interfaces extending on opposite lateral sides of the first support, and first and second component mounts on at least one of the first support, and respective ones of the first and second connecting interfaces, the first and second component mounts defining a mounting plane spaced apart from the first support and operable to hold a rigid component in the mounting plane. The first and second connecting interfaces have first and second connecting surfaces disposed at negative and positive angles respectively to the mounting plane, for connecting the apparatus to an adjacent similar apparatus.

The first and second connecting interfaces and the first support may form a unitary body.

The unitary body may be formed from an electrically insulating material.

The electrically insulating material may include a thermoplastic material.

The unitary body may be formed of an electrically conductive material.

The unitary body may be formed by laminating, machining, casting, extruding, injection molding or stamping.

The unitary body may be anodized.

The first and second component mounts may include first and second component holders respectively.

The first support may include a resilient portion operable to flex to permit the first and second component holders to be moved laterally relative to each other to receive and grip the rigid component between the first and second component holders The first and second component holders may include first and second elongated linear portions respectively.

The first and second component holders may have first and second receptacles for receiving and holding portions of the rigid component.

The apparatus may further include first and second pluralities of spaced apart retainers on the first and second component holders respectively for retaining the portions of the rigid component in the first and second receptacles respectively.

The first and second pluralities of spaced apart retainers may be integrally formed in the first and second component holders respectively.

Each of the first and second component holders may have a first end portion and a second end portion.

The first and second end portions of each of the first and second component holders may extend outwardly beyond extremities of the first support.

The first end portions may have shapes complementary to the second end portions to permit the first end portions of the first and second component holders to couple with second end portions of first and second component holders of a longitudinally adjacent similar component mounting apparatus.

The first and second component mounts may include at least one standoff operable to hold the rigid component.

The positive and negative angles may be about +30 degrees, +45 degrees, +54 degrees, or +60 degrees and about −30 degrees, −45 degrees, −54 degrees, or −60 degrees respectively.

The positive and negative angles may be from 0 degrees to +90 degrees and from 0 degrees to −90 degrees respectively.

The first and second connecting interfaces may each have at least one open mesh.

The first and second connecting interfaces may be rigid.

The first and second connecting interfaces may be integrally formed with the first and second parallel spaced apart component mounts respectively.

The apparatus may further include first and second connectors on the first and second connecting interfaces respectively.

The first and second connectors may be complementary connectors.

The first and second connectors may be female and male connectors respectively.

The first support may include a connecting portion extending between the first and second connecting interfaces.

The connecting portion may be flexible and resilient.

The connecting portion may be rigid.

The connecting portion may be curved.

The connecting portion may include a central vertex.

The connecting portion may be planar.

The connecting portion may include at least one open mesh.

The first and second connecting interfaces may have first and second distal surfaces respectively.

In accordance with another aspect of the invention, there is provided a component holder apparatus including any of the above described apparatuses and a rigid component held by the first and second component mounts.

In accordance with another aspect of the invention, there is provided a component mounting assembly including a plurality of any of the above described apparatuses connected together at the connecting interfaces.

The component mounting assembly may include a plurality of rigid components, each held by the first and second component mounts of respective ones of the plurality of apparatuses.

In accordance with another aspect of the invention, there is provided a component mounting assembly including a plurality of any of the above described apparatuses, where the first and second connecting interfaces have first and second distal surfaces respectively, connected together at the connecting interfaces, such that the distal surfaces of the connecting interfaces lie on a circle having a center coincident with a center of the assembly.

In accordance with another aspect of the invention, there is provided a first-level component holder assembly including the above component mounting assembly and a plurality of rigid components, each held by the first and second component mounts of respective ones of the plurality of apparatuses.

In accordance with another aspect of the invention, there is provided a second-level component holder assembly comprising a hollow cylindrical enclosure having an inner cylindrical surface and the above described first-level component holder assembly, the first and second distal surfaces of respective ones of the plurality of apparatuses contacting the inner cylindrical surface to secure the plurality of apparatuses in the cylindrical enclosure.

In accordance with another aspect of the invention, there is provided an apparatus for holding rigid components. The apparatus includes an elongated support having a plurality of projections and component mounting areas disposed longitudinally parallel to a common longitudinal axis of the support and disposed between the projections, the projections having distal surfaces lying on a circle having a center coincident with the longitudinal axis. The apparatus also includes component mounts on each of the component mounting areas the component mounts defining respective mounting planes in spaced apart relation to respective ones of the component mounting areas and operable to hold respective rigid components in the respective mounting planes.

The support may include a unitary body.

The unitary body may be formed from an electrically insulating material.

The electrically insulating material may include a thermoplastic material.

The unitary body may be formed of an electrically conductive material.

The unitary body may be formed by laminating, machining, casting, extruding, injection molding or stamping.

The unitary body may be anodized.

The component mounts may include first and second parallel spaced apart component holders on each of the component mounting areas for holding respective ones of the rigid components.

The support may be integrally formed with the first and second component holders.

The component mounts may include standoffs for holding the respective rigid components.

At least one of the mounting areas may include a wall defining a cylindrical recess extending longitudinally in the elongated support for receiving and holding an inner rigid component.

In accordance with another aspect of the invention, there is provided a component holder apparatus including the above described apparatuses and a plurality of rigid components held by the component mounts in the respective mounting planes.

In accordance with another aspect of the invention, there is provided a component holder assembly including a hollow cylindrical enclosure having an inner cylindrical surface and the above described component holder apparatus, the distal surfaces of respective ones of the projections contacting the inner cylindrical surface to secure the component holder apparatus in the cylindrical enclosure.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
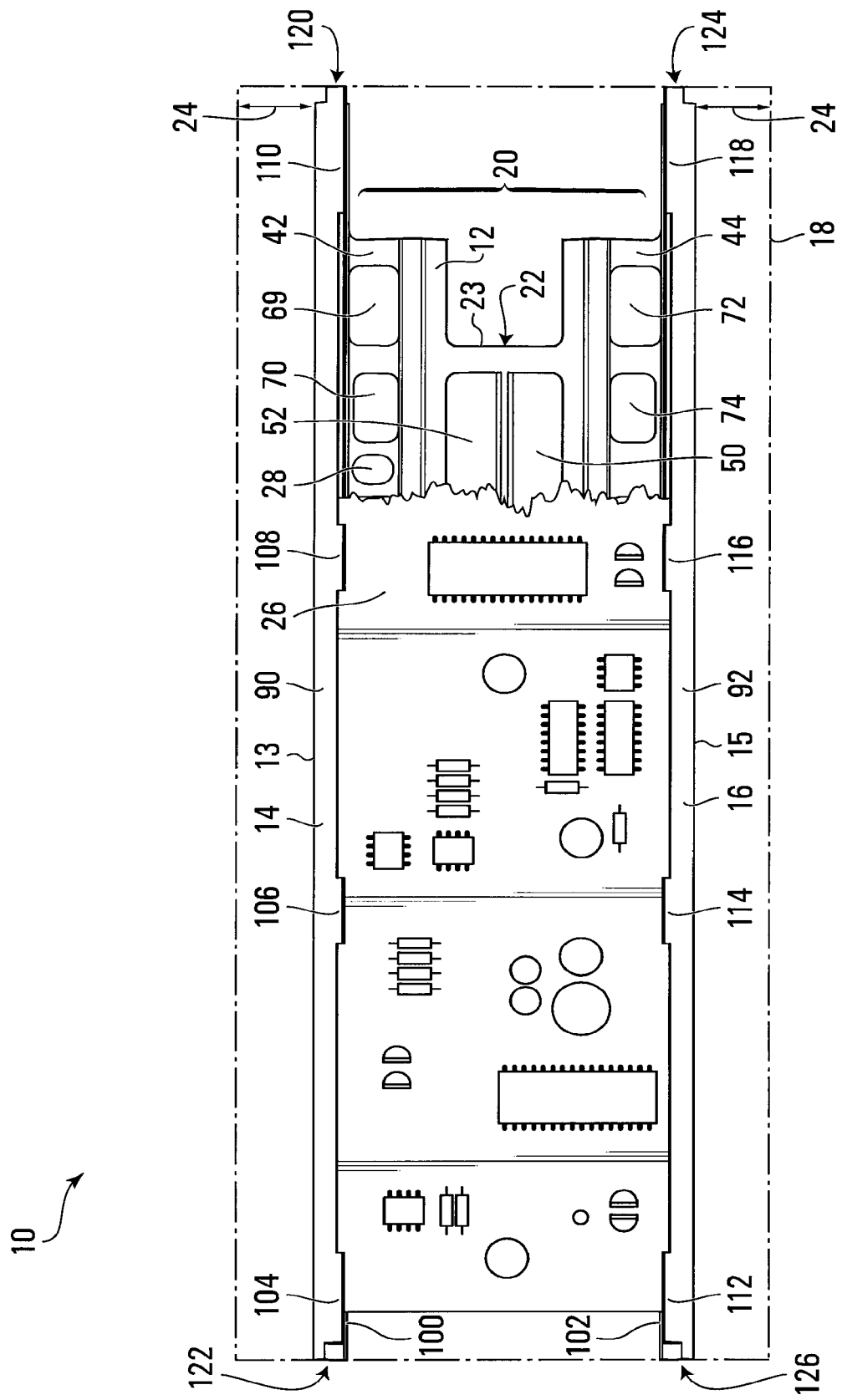
FIG. 1 is a perspective view of a first-level component holder assembly employing a component mounting apparatus according to a first embodiment of the invention.

Referring to FIG. 1, a component mounting apparatus for holding a rigid component in a downhole bore or downhole collar based application according to a first embodiment of the invention is shown generally at 10. The apparatus includes a first body 12 having first and second component mounts 13 and 15 and a first support shown generally at 20 connecting the component mounts together. In the embodiment shown, the first and second component mounts 13 and 15 include first and second parallel spaced apart component holders 14 and 16 disposed in and defining a first common plane or mounting plane 18. However in another embodiment, such as the embodiment shown in FIGS. 15 and 16, first and second component mounts may include first and second standoffs.

Figure 2:
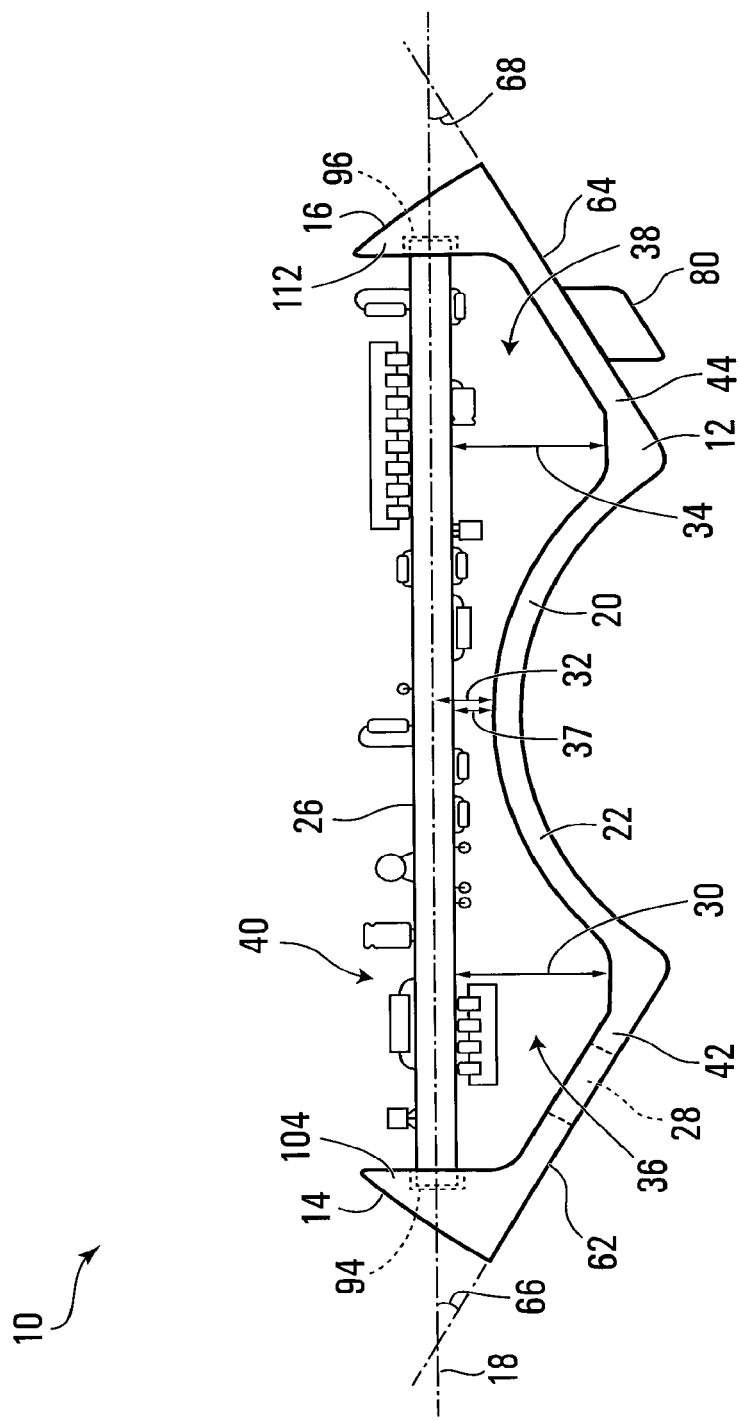
FIG. 2 is an end view of the first-level component holder assembly shown in FIG. 1.

Referring to FIG. 2, the first support 20 includes first and second connecting interfaces 42 and 44 and a connecting portion 22, which connects the first and second connecting interfaces 42 and 44 together. The connecting portion 22 extends between the first and second connecting interfaces 42 and 44 longitudinally along the length of the first body 12.

In one embodiment, the apparatus 10 is made of a unitary body. The unitary body may be formed from an electrically insulating material, which in one embodiment comprises a thermoplastic material, for example. In other embodiments the unitary body may be formed of a composite material, fiberglass, carbon fibre, or rubber. Alternatively the unitary body may be formed of an electrically conductive material, such as a metal. The metal may be aluminum, for example. The body may be formed by laminating, machining, casting, extruding, injection molding, or stamping. Any of the above mentioned body materials may be anodized.

Referring back to FIG. 1, the connecting portion 22 may include a resilient portion 23 operable to flex to permit the first and second component holders 14 and 16 to be moved laterally in the direction shown by arrows 24, relative to each other, to receive a rigid component shown generally at 26 between the first and second component holders so that these holders can grip the rigid component. Alternatively, the connecting portion 22 may be rigid.

The rigid component 26 may be a circuit board or other rigid mounting substrate, for example.

In the embodiment shown, the connecting portion 22 is curved and includes at least one open mesh, two of which are shown at 50 and 52 in FIG. 1. Similarly, the first and second connecting interfaces 42 and 44 may each have at least one open mesh, four of which are shown generally at 69, 70 and 72, 74. Where the body is formed by injection molding, the meshes 50, 52, 69, 70, 72, and 74 may allow the body to cool evenly and avoid warping during manufacturing. Where the body is not formed by injection molding, the connecting portion 22 and the first and second connecting interfaces 42 and 44 may be formed with or without meshes.

The first and second connecting interfaces 42 and 44 may be more rigid relative to the connecting portion 22 and such relatively greater rigidity can be provided by using the same material for the entire body and making the meshes 50 and 52 in the connecting portion 22 larger in the longitudinal direction of the body than the meshes 69, 70, 72 and 74 in the first and second connecting interfaces, for example, or a greater material thickness can be provided in the first and second connecting interfaces 42 and 44 than is provided for the connecting portion 22. Where the connecting portion 22 is to be rigid, the connecting portion may be formed of a more rigid material with or without meshes.

Figure 7:
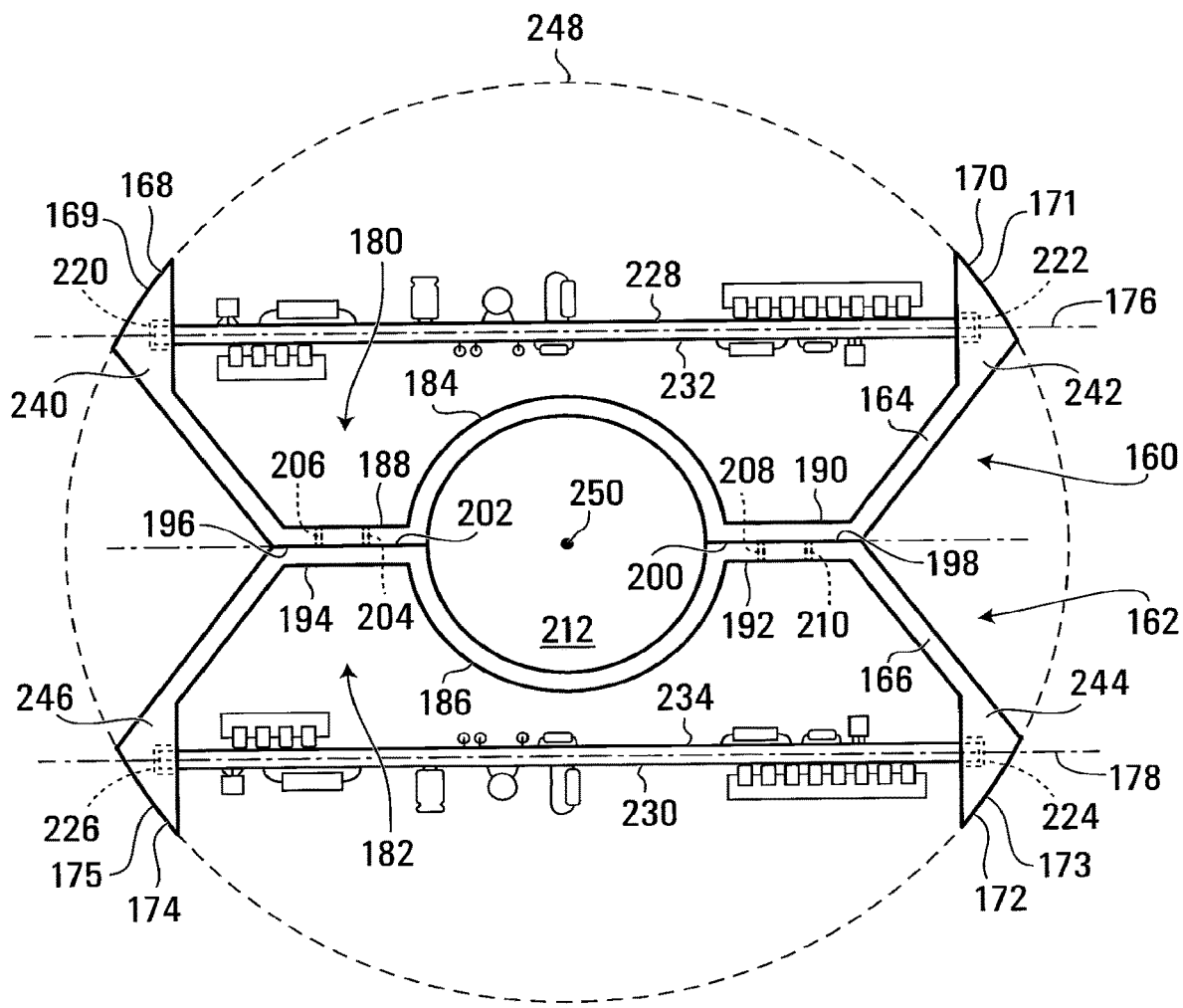
FIG. 7 is an end view of a first-level component holder assembly employing a mounting apparatus according to a second embodiment of the invention.
Figure 9:
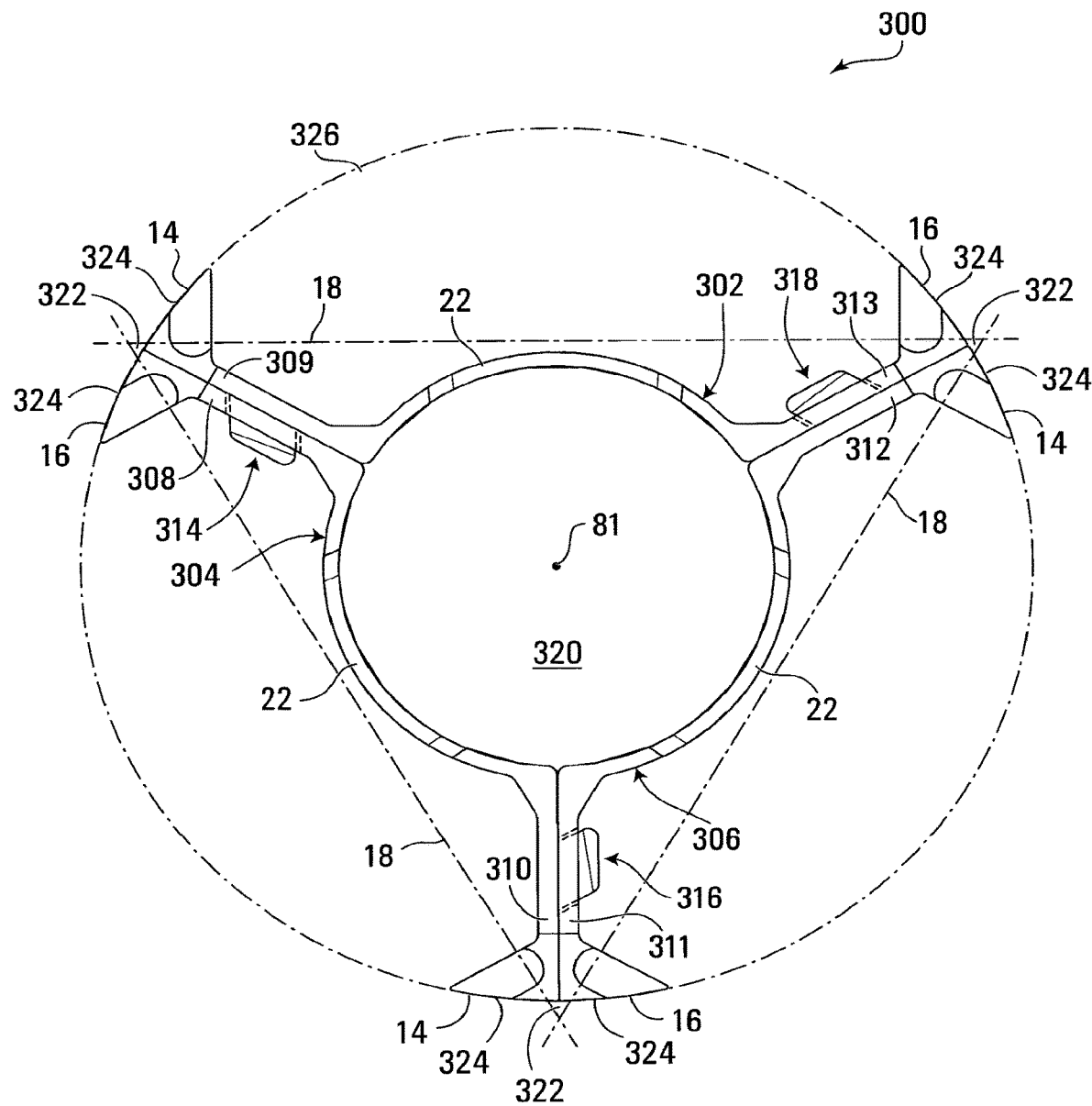
FIG. 9 is an end view of a first-level mounting assembly employing the mounting assembly shown in FIG. 1, 2, 5 or 6.

Referring to FIG. 2, the first support 20 has a first connector 28 for connecting the first body 12 to a corresponding connector of a second support of a second body of a second similar mounting apparatus as shown in FIGS. 7 and 9, for example, where the connectors are shown at 204, 206 and 208, 210, for example.

Referring back to FIG. 2, the first common plane 18 extends through the first and second component holders 14 and 16 and is coincident with an axial plane of the rigid component 26 held by the first and second component holders 14 and 16. The first support 20 is spaced apart such as shown at 30, 32, and 34, from the first common plane 18 so as to provide spaces shown at 36, 37 and 38, for example, where components mounted on the underside of the circuit board can be positioned when the circuit board is held by the first and second component holders 14 and 16. In addition, of course, circuit components can be mounted on an opposite side of the circuit board as shown generally at 40.

Still referring to FIG. 2, the first and second connecting interfaces 42 and 44 are disposed between the connecting portion 22 and the first and second component holders 14 and 16, respectively. The first and second connecting interfaces 42 and 44 are generally flat and planar and have first and second flat planar surfaces 62 and 64, respectively. These flat planar surfaces 62 and 64 are disposed at different angles shown at 66 and 68, respectively, to the first common plane 18. In the embodiment shown, the angles 66 and 68 are each about 30 degrees. The angle 66 may be regarded as a negative 30 degree angle whereas the angle 68 may be regarded as a positive 30 degree angle, for example. The first and second flat planar surfaces 62 and 64 could, however, be disposed at different angles to the first common plane 18 to provide for greater or lesser spacing of the first support 20 to provide more space in the spaces 36, 37 and 38 to accommodate components on the back side of the rigid component 26, for example. Examples of apparatuses having first and second interfaces disposed at different angles are shown in FIGS. 7, 8, and 11, 12, 13, 14, 15, 16, and 17.

The apparatus 10 shown in FIG. 2 is configured to be connected to two other similar apparatuses to form an assembly such as shown in FIG. 9. However, in other embodiments, a component holder apparatus similar to that shown in FIG. 2 may be adapted to be connected to another number of similar apparatuses such as shown in FIGS. 12, 14, 15, 16, 17, 18, 19 and 20 for example. In such embodiments, angles similar to the angles 66 and 68 of the apparatus 10 would have absolute values varying between 0 degrees, which may occur when two apparatuses are to be connected back to back, such as shown in FIG. 7, and approaching 90 degrees as the number of apparatuses joined together increases. For example, in the embodiment shown in FIG. 17, four apparatuses may be connected together, wherein the angles similar to the angles 66 and 68 may be negative 45 degrees and positive 45 degrees, respectively. In the embodiment shown in FIG. 18, five apparatuses may be connected together, wherein the angles similar to the angles 66 and 68 may be negative 54 degrees and positive 54 degrees, respectively. In the embodiment shown in FIG. 19, six apparatuses may be connected together, wherein the angles similar to the angles 66 and 68 may be negative 60 degrees and positive 60 degrees, respectively.

Referring back to FIG. 2, in the embodiment shown, the first and second connecting interfaces 42 and 44 are integrally formed with the first and second parallel spaced apart component holders 14 and 16, respectively. The first connecting interface 42 has the first connector 28, which in this embodiment, is simply a cylindrical opening extending through the first connecting interface 42. Similarly, the second connecting interface 44 has a connector 80 which in this embodiment is a protrusion extending from the flat planar surface 64 and having a shape complementary to the opening of the first connector 28 to provide a friction fit, for example to facilitate the component mounting apparatus such as shown in FIG. 2 to be connected together in a manner such as shown in FIG. 9, for example where three of such apparatuses having complementary female and male connectors respectively are connected together to extend about a longitudinal axis 81.

Referring back to FIG. 1, the first and second component holders 14 and 16 include first and second elongated linear portions 90 and 92 respectively. Referring back to FIG. 2 in the embodiment shown, the first and second component holders 14 and 16 are generally triangular shaped in cross-section and have first and second receptacles 94 and 96, respectively, that extend nearly the entire length of the first and second component holders 14 and 16 for receiving and holding portions of the rigid component 26. These receptacles 94 and 96 can receive and hold opposite edges of a circuit board for example, as shown in FIG. 1. In the embodiment shown, the first and second component holders 14 and 16 have first and second pluralities 100 and 102, respectively, of retainers 104, 106, 108, 110 and 112, 114, 116, 118, respectively that further secure the edges of the circuit board, for example, in the receptacles 94 and 96.

Figure 3:
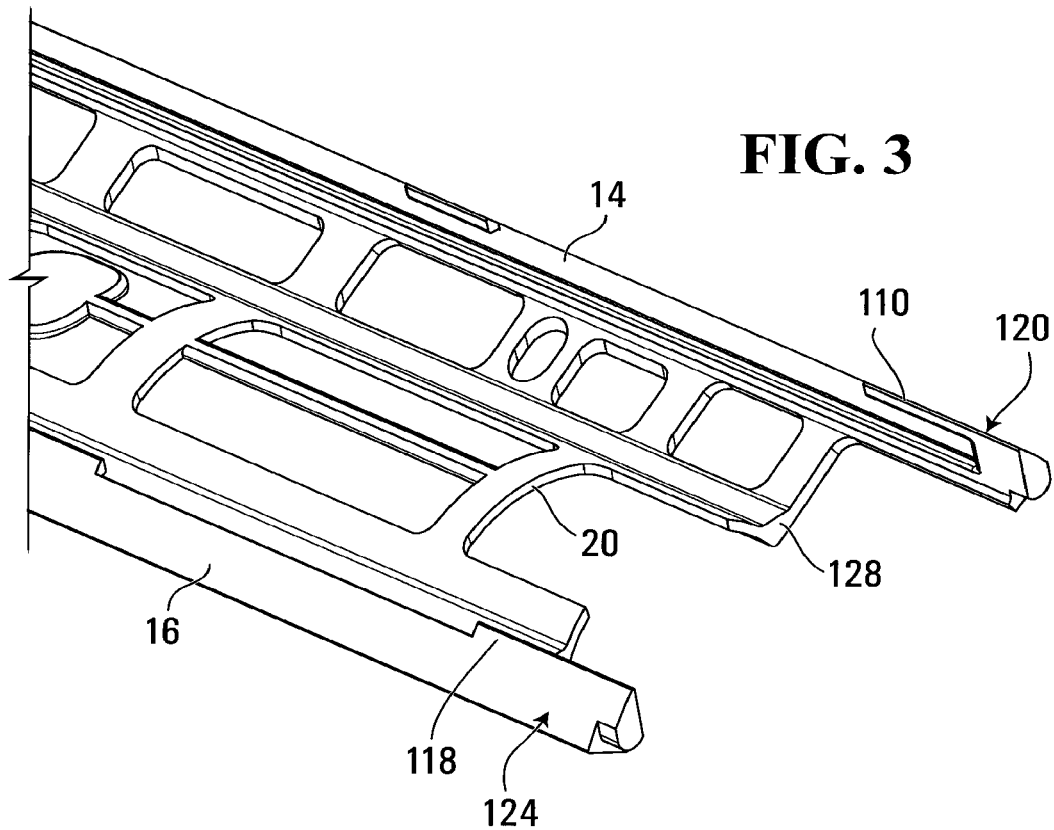
FIG. 3 is a fragmented perspective view of a first end portion of the component mounting apparatus used in the first-level component holder assembly shown in FIG. 1.
Figure 4:
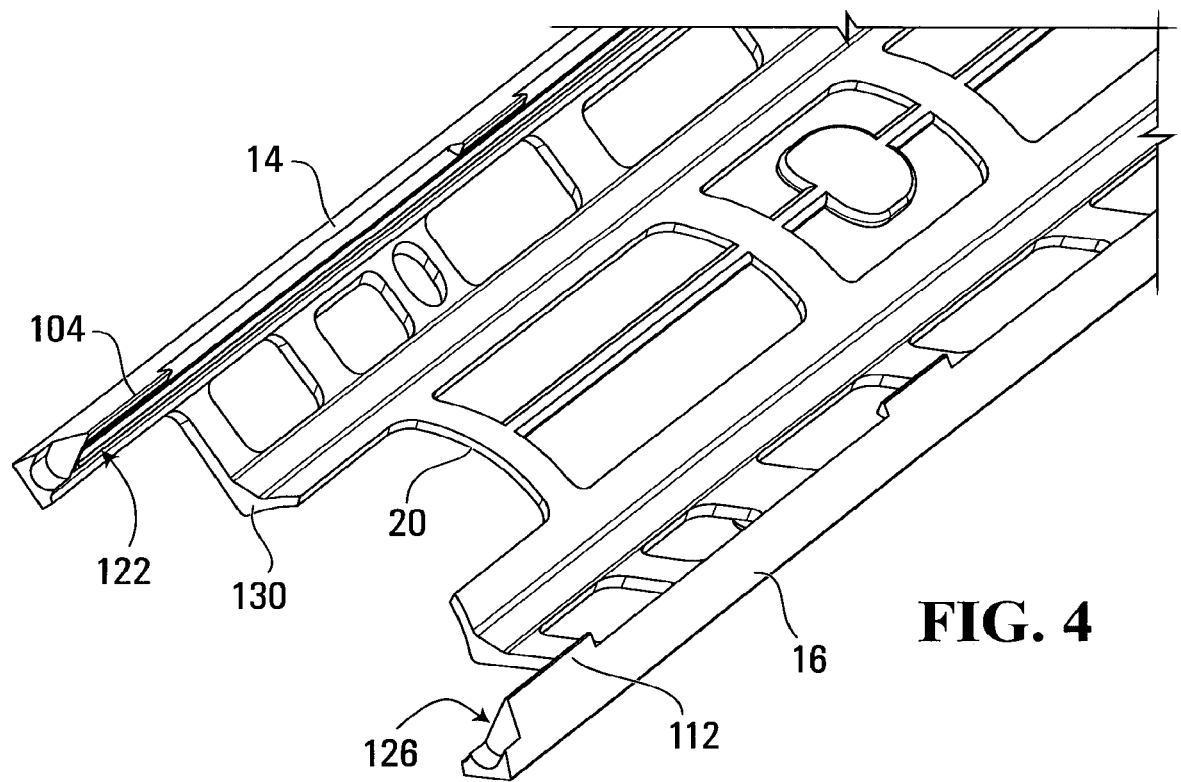
FIG. 4 is a fragmented perspective view of a second end portion of the component mounting apparatus shown in FIG. 3.
Figure 5:
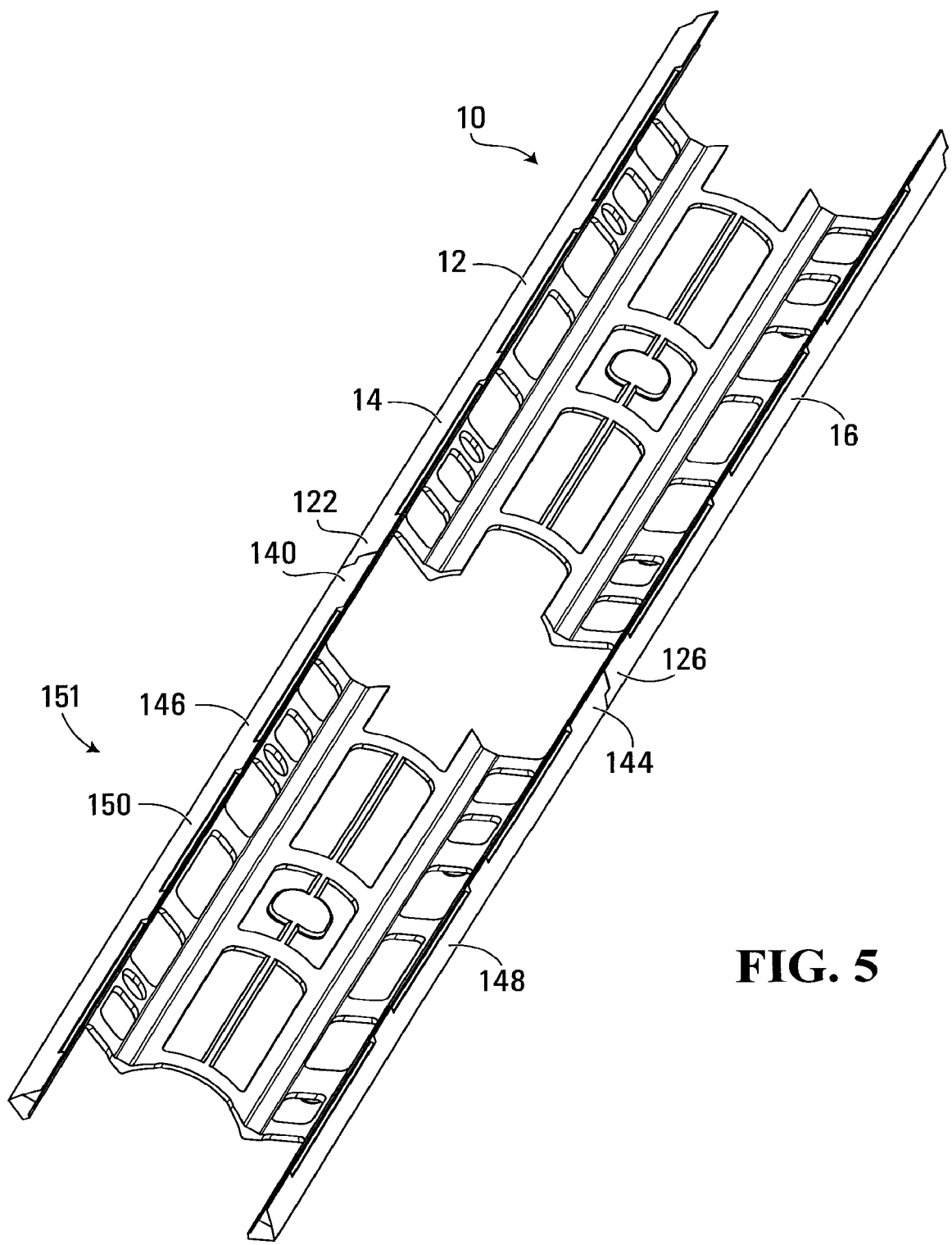
FIG. 5 is a perspective view of a first-level mounting assembly formed by coupling the mounting apparatus shown in FIGS. 1-4 with a longitudinally adjacent similar apparatus.

Referring back to FIG. 1, in the embodiment shown, the first and second component holders 14 and 16 have first and second end portions 120, 122, and 124, 126. Referring to FIG. 3, the first end portions 120 and 124 of the first and second component holders 14 and 16, respectively, are shown in greater detail and referring to FIG. 4, the second end portions 122 and 126 of the first and second component holders 14 and 16 are shown in greater detail. Referring to FIGS. 3 and 4, in the embodiment shown, it can be seen that the first end portions 120 and 124 extend outwardly beyond a first extremity 128 of the first support 20 and the second end portions 122 and 126 extend outwardly beyond a second extremity 130 of the first support 20. Also, in the embodiment shown, the first and second end portions 120 and 122 of the first component holder 14 are complementary to each other, the first end portion 120 being a male portion and the second end portion 122 being a female portion. Similarly, in the embodiment shown, the first and second end portions 124 and 126 of the second component holder 16 are complementary to each other, wherein the first end portion 124 is a male portion and the second end portion 126 is a female portion. Referring to FIG. 5, the complementary nature of the first and second end portions in this embodiment permits the second end portions 122 and 126 of the first and second component holders 14 and 16 of the first body 12 of the apparatus 10 to receive first end portions 140 and 144, of third and fourth component holders 146 and 148 of a second body 150 (similar to the first body 12) of a second apparatus 151. The complementary shape of the mating first and second end portions 140, 122 and 144, 126 serve to align the first and third component holders 14 and 146 and the second and fourth component holders 16 and 148. However, causing the opposite end portions to be complementary is not absolutely necessary and if desired the opposite end portions need not be complementary.

Figure 6:
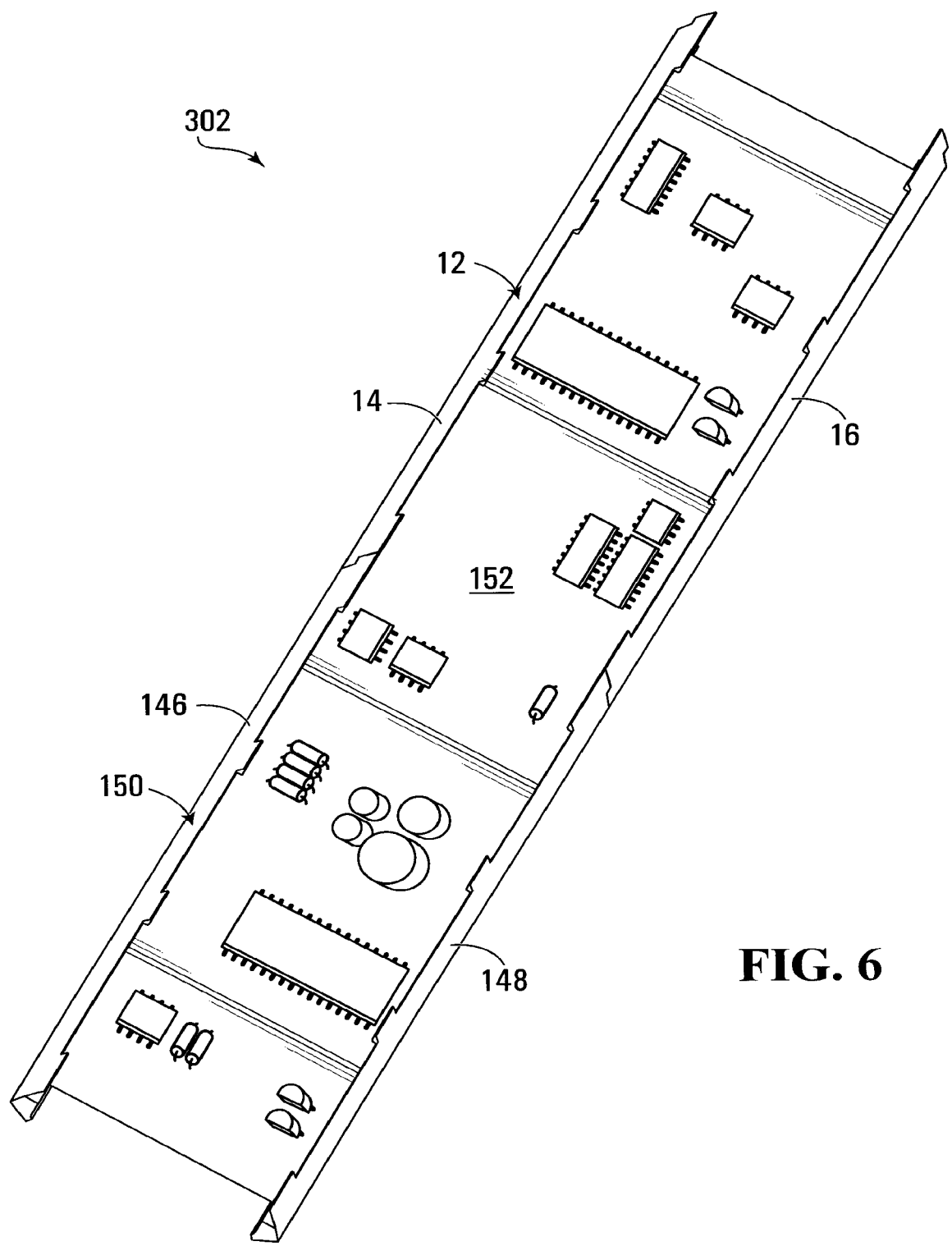
FIG. 6 is a perspective view of a first-level component holder assembly comprising the mounting assembly shown in FIG. 5 holding a rigid component.

Referring to FIGS. 5 and 6, with the first and second bodies 12 and 150 coupled together end to end, a rigid component 152 such as a long printed circuit board spanning about the length of the two apparatuses 10 and 151, i.e. the overall length of the first and second bodies 12 and 150 coupled end to end, i.e. longitudinally adjacent, can be held by the first and second component holders 14, 16 and the third and fourth component holders 146, 148 of the apparatuses 10 and 151 respectively to form a first first-level mounting assembly 302. It will be appreciated that the first and second bodies 12 and 150 are similar and they each hold a respective portion of the rigid component 152 (which in this embodiment is a printed circuit board).

It will be appreciated that any number of similar bodies of the type shown in FIGS. 1 through 4 can be coupled linearly end to end, to make a mounting assembly of a desired linear length, in increments of a length of the single apparatus 10 shown in FIG. 1, for example. This length may be 6 inches (15. 24 cm), for example. Alternatively, one or both of the linearly positioned mounting assemblies can be cut to a length sufficient to include at least one pair of retainers 104, 112; 106, 114; 108, 116; 110, 118; to provide a mounting assembly having a length that is a fraction of the unit length of one component mounting apparatus or n component mounting apparatuses plus one fraction of a unit length of one component mounting apparatus.

Referring to FIG. 7, third and fourth mounting apparatuses 160 and 162 according to a second embodiment are shown. The third and fourth apparatuses 160 and 162 are similar to but not identical to the apparatus 10 shown in FIGS. 1 through 4 and are connected together in a back to back relationship. In this embodiment, the first and second apparatuses are comprised of first and second bodies 164 and 166, respectively, each having first and second component mounts 169, 171 and 173, 175. In the embodiment shown, the first and second component mounts 169, 171 and 173, 175 include first and second parallel spaced apart component holders 168, 170 and 172, 174 respectively disposed in or defining respective common planes 176, 178 and connected together by respective supports 180, 182 having respective connecting portions 184, 186 respectively. The connecting portions 184, 186 may be resilient but need not be.

Each of the supports 180, 182 also has first and second connecting interfaces 188, 190 and 192, 194 having respective flat surfaces 196, 198, 200, and 202 which are abutting. The first and second bodies 164 and 166 also include complementary connectors 204, 206 and 208, 210 operable to frictionally engage to join the first and second bodies 164 and 166 together. The first and second connecting interfaces 188, 190 and 192, 194 are generally rigid and the connecting portions 184 and 186 may also be generally rigid.

In the embodiment shown, the connecting portions 184 and 186 are curved to form a circular cylindrical space 212 between the connecting portions 184 and 186 of the first and second bodies 164 and 166. While the curved connecting portions 184, 186 provide a relatively strong structural form, the connecting portions may be made with other shapes that define symmetrically shaped geometric spaces. Components such as batteries or capacitors, for example, may be received and held in the circular cylindrical space 212.

Adjacent the flat surfaces 196, 198 and 200, 202, the first and second connecting interfaces 188, 190 and 192, 194 of the first and second bodies 164, 166 extend away from respective planes defined by the abutting flat surfaces 196, 202 and 198, 200 generally at a 45 degree angle to this plane and are terminated at the first and second component holders 168, 170 and 172, 174 which are integrally formed therewith. The first and second component holders 168, 170 and 172, 174 are generally the same as those described above in connection with FIGS. 1 through 4 and include respective receptacles 220, 222, and 224, 226 for holding portions of first and second rigid components 228 and 230, respectively. Again, an axial plane of the first rigid component 228 is coincident with the common plane 176, and an axial plane of the second rigid component 230 is coincident with the common plane 178. In the embodiment shown, the common planes 176 and 178 are parallel. The common planes 176 and 178 are spaced apart from the connecting portions 184 and 186, respectively, to create a space between the connecting portion 184 and the first and second connecting interfaces 188, 190 in the case of the first body 164 and to create a space between the connecting portion 186 and the first and second connecting interfaces 192, 194 in the case of the second body 166 to again provide for a space between respective inwardly facing sides 232 and 234 of each of the first and second rigid components 228 and 230 to permit components such as electronic or electrical components to be mounted on the inwardly facing sides 232 and 234.

In the embodiment shown, whereas the above mentioned portions of the first and second connecting interfaces 188, 190 and 192, 194 are shown to extend at a 45 degree angle to the common planes 176 and 178, any angle and length that permits the common planes 176 and 178 to be spaced apart from the connecting portions 184 and 186 to allow a rigid component connected to the first and second component holders 168, 170, and 172, 174 of the respective first and second bodies 164 and 166 to be held thereby is contemplated. In addition, while the first and second connecting interfaces 188, 190, and 192, 194 in this embodiment have been shown to be comprised of first and second portions disposed at an angle, formed by two linear portions, these portions need not be linear and could alternatively be curved or solid non-linear shapes, if desired. The above-mentioned configuration may provide for structural integrity, however.

In the embodiment shown in FIG. 7, the 45 degree angles and lengths of the first and second connecting interfaces 188, 190, and 192, 194 of each of the first and second bodies 164, 166 are selected such that outer surfaces 240, 242, and 244, 246 of the respective first and second component holders 168, 170, and 172, 174 are coincident with a circle 248 having a centre 250 coincident with an axis of the circular cylindrical space 212 defined by the connecting portions 184, 186. This enables the third and fourth apparatuses 160 and 162 to be received in a circular cylindrical enclosure having an inner wall surface (not shown) of equal or greater diameter relative to the diameter of the circle 248.

Figure 8:
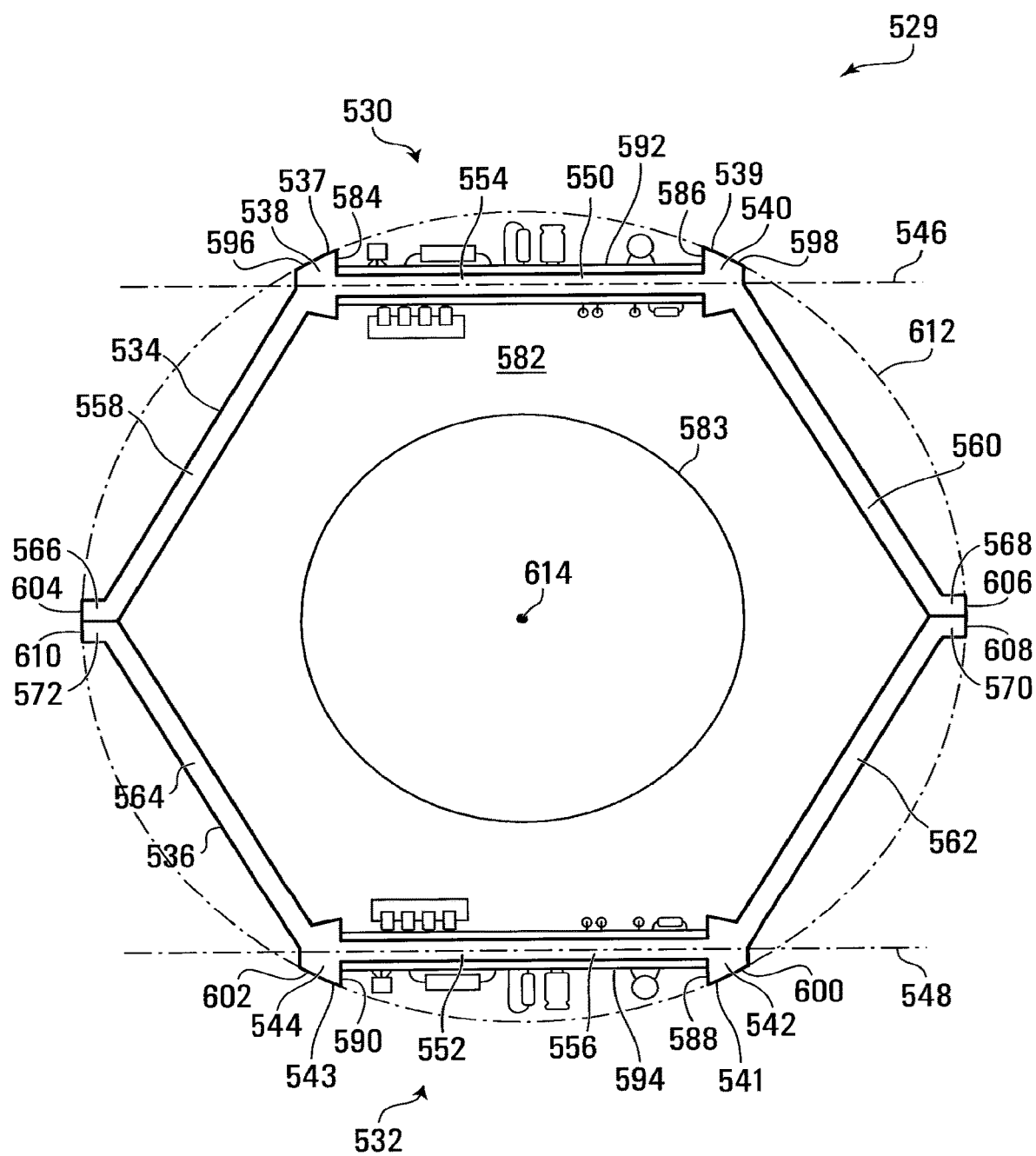
FIG. 8 is an end view of a first-level component holder assembly employing a mounting apparatus according to a third embodiment of the invention.

Referring to FIG. 8, a first-level component holder assembly employing mounting apparatuses according to a third embodiment is shown generally at 529. The assembly 529 includes fifth and sixth mounting apparatuses 530 and 532, connected together. In this embodiment, the fifth and sixth apparatuses 530 and 532 are similar to but not identical to the third and fourth apparatuses 160 and 162 described above in connection with FIG. 7. The fifth and sixth apparatuses 530 and 532 are comprised of first and second bodies 534 and 536, respectively, each having first and second component mounts 537, 539 and 541, 543. In the embodiment shown, the first and second component mounts 537, 539 and 541, 543 include first and second parallel spaced apart component holders 538, 540 and 542, 544 respectively, disposed in respective common planes 546, 548 and connected together by respective supports 550, 552 having respective connecting portions 554, 556 respectively. Each of the supports 550, 552 also has first and second connecting legs 558, 560 and 562, 564 having respective connecting interfaces 566, 568, 570, and 572 having abutting flat surfaces. The connecting interfaces 566, 568, 570, and 572 and the flat surfaces are generally similar to the connecting interfaces 188, 190 and 192, 194 and the flat surfaces 196, 198, 200, and 202 discussed above in connection with to FIG. 7. In one embodiment, the connecting legs 558, 560 and 562, 564 may be flexible, but in other embodiments the legs may be rigid. Similarly, in some embodiments the connecting portions 554, 556 may be flexible, but in other embodiments, the connecting portions may be rigid. The connecting portions 554, 556 and the connecting legs 558, 560 and 562, 564 form a space 582 between the connecting portions 554, 556 and the connecting legs 558, 560 and 562, 564. A component 583 such as a battery or a capacitor bank, for example, may be received and held in the space 582. The first and second component holders 538, 540 and 542, 544 are generally the same as those described above in connection with FIGS. 1 through 7 and include respective receptacles 584, 586, and 588, 590 for holding portions of first and second rigid components 592 and 594, respectively.

The lengths of the first and second connecting legs 558, 560 and 562, 564 of each of the first and second bodies 534 and 536 are selected such that outer surfaces 596, 598, 600, and 602 of the first and second component holders 538, 540 and 542, 544 and outer surfaces 604, 606, 608 and 610 of the first and second connecting legs 558, 560 and 562, 564 are coincident with a circle 612 having a centre 614 coincident with a centre of the space 582. This enables the fifth and sixth apparatuses 530 and 532 to be received in a circular cylindrical enclosure having an inner wall surface (not shown) of equal or greater diameter relative to the diameter of the circle 612.

Referring to FIG. 9, a first-level mounting assembly employing three mounting assemblies 302, 304, and 306, each employing the component holder apparatus 10 shown in FIGS. 1-4 is shown generally at 300. The first, second, and third mounting assemblies 302, 304, 306 are connected together at respective connecting interfaces shown generally at 308-313 by respective connectors 314, 316, and 318 such that the first component holder 14 of each of the mounting assemblies is immediately adjacent to and abutting the second component holder 16 of an adjacent one of the first second and third mounting assemblies 302, 304, 306. In addition, the connecting portions 22 of the first, second and third mounting assemblies 302, 304, 306 respectively define a circular cylindrical space 320 between the first common planes 18 of the first, second and third mounting assemblies 302, 304, 306. While in the embodiment shown, each of the connecting portions 22 of the first, second and third mounting assemblies 302, 304, 306 follow approximately ⅓ of an arc of a circle. In other embodiments where the spacing of the component holders 14 are not even or where there are a different number of mounting assemblies, the connecting portions 22 may follow between 0 degrees and 180 degrees of an arc of a circle. The first common planes 18 are disposed at 60 degree angles relative to each other as shown at 322. Outer surfaces 324 of the first and second component holders 14 and 16 of the first, second and third mounting assemblies 302, 304, 306 are coincident with a circle 326 having a centre coincident with a centre of the circular cylindrical space 320 formed by the connecting portions 22 of the first, second and third mounting assemblies 302, 304, 306. This enables the assembly to be mounted in a circular enclosure having an inner wall with a diameter equal to or greater than the diameter of the circle 326.

It should be noted that in some embodiments the mounting assemblies 302, 304, 306, need not be symmetrical. For example, mounting assembly 302 can be shorter than mounting assemblies 304 and 306, or vice versa. Any combination of lengths of mounting assemblies 302, 304, 306 can be used.

Figure 10:
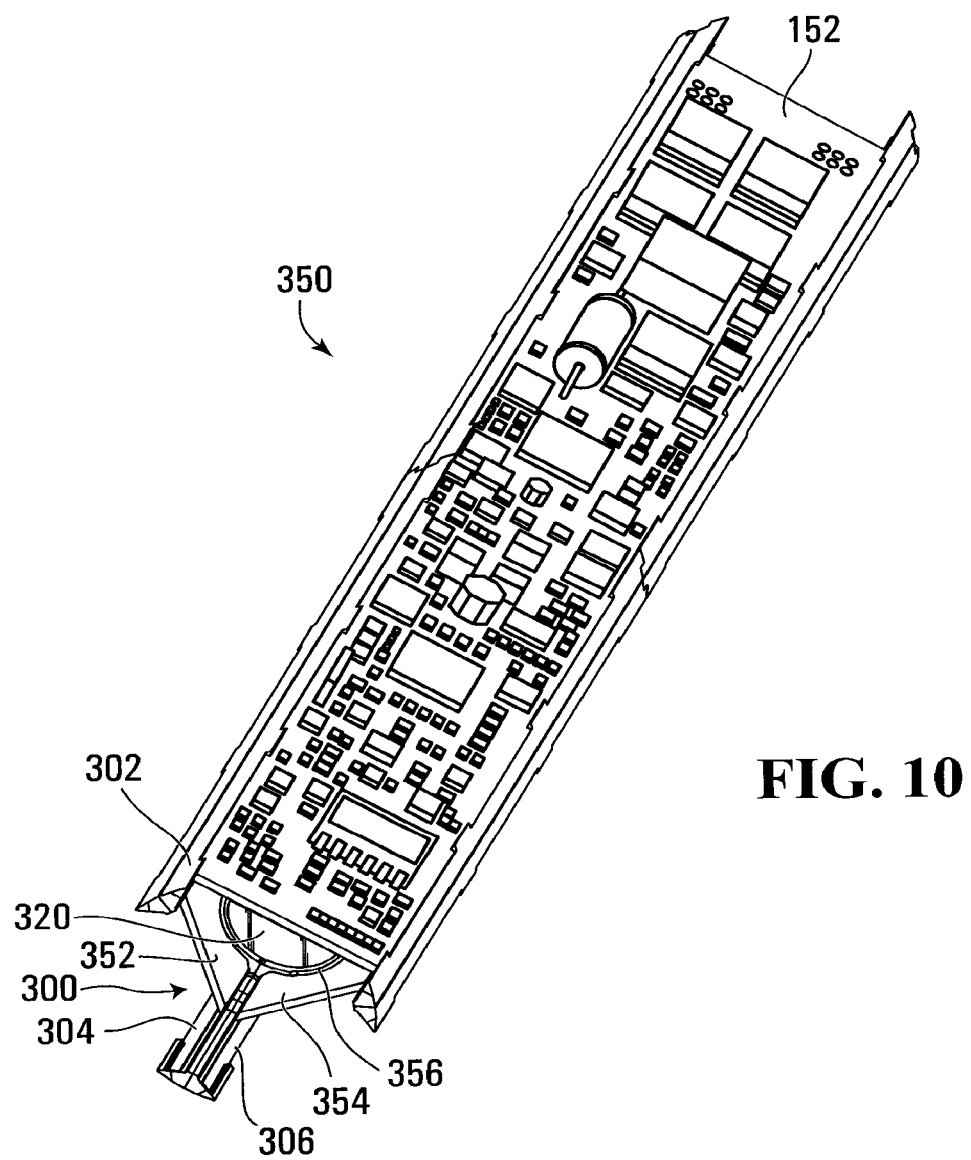
FIG. 10 is a perspective view of a first-level component holder assembly comprising the first-level mounting assembly shown in FIG. 9 holding three rigid components.

Referring to FIG. 10, the component holder assembly shown in FIG. 6 is shown along with two other similarly arranged assemblies in the configuration shown in FIG. 9 to depict an alternate first-level component holder assembly 350. It will be appreciated that the view shown in FIG. 9 is the same view that would be seen if the mounting assembly 300 of FIG. 9 were to be made from three units of the apparatus shown in FIGS. 1 through 4 or three units of the mounting assembly shown in FIGS. 5 and 6. FIG. 10, for example, depicts the first, second, and third mounting assemblies 302, 304 and 306 shown in FIG. 9 holding the rigid component 152 described in connection with FIG. 6 (first circuit board), and second and third circuit boards 352, and 354 respectively. In this embodiment, an inner rigid component 356 is held within the circular cylindrical space 320. The inner rigid component 356 may include an electrical, mechanical or electromechanical device. In this embodiment, the inner rigid component 356 is a capacitor. Alternatively or in addition, a battery or other component may be held within the circular cylindrical space 320.

Figure 11:
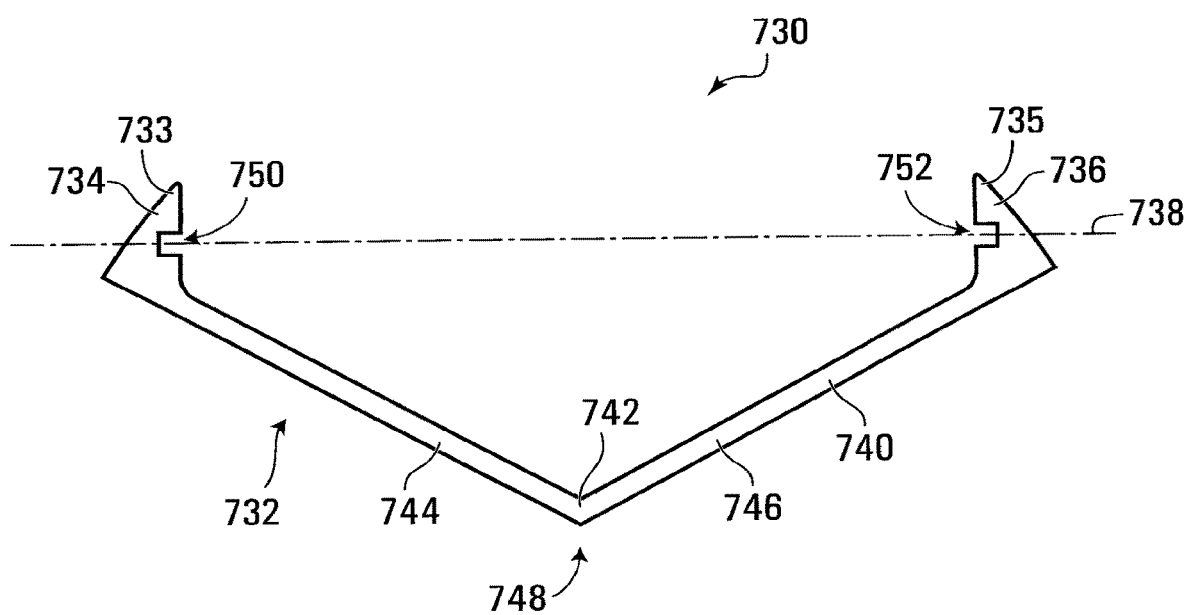
FIG. 11 is an end view of a component mounting apparatus according to a fourth embodiment of the invention.

Referring now to FIG. 11, a component mounting apparatus according to a fourth embodiment of the invention is shown generally at 730. The apparatus 730 is similar to but not identical to the apparatus 10 described above in connection with FIGS. 1-4. The apparatus 730 comprises a first body 732, having first and second component mounts 733 and 735. In the embodiment shown, the first and second component mounts 733 and 735 include first and second parallel spaced apart component holders 734 and 736 disposed in and defining a common plane 738 and connected together by a support 740 having a connecting portion 742. The first and second component holders 734 and 736 are generally the same as those described above in connection with FIGS. 1 through 4 and 7 and include respective receptacles 750 and 752 for holding portions of a rigid component (not shown) such that the rigid component is held spaced apart from the support 740.

The support 740 also has connecting interfaces 744 and 746 having flat surfaces. The connecting interfaces 744 and 746 may be similar to the connecting interfaces 42 and 44 of the apparatus 10 described above having regard to FIGS. 1-4. In the embodiment shown in FIG. 11, the apparatus 730 differs from the apparatus 10 shown in FIGS. 1-4 in at least that the connecting portion 742 includes a central vertex 748 rather than a curved portion.

Figure 12:
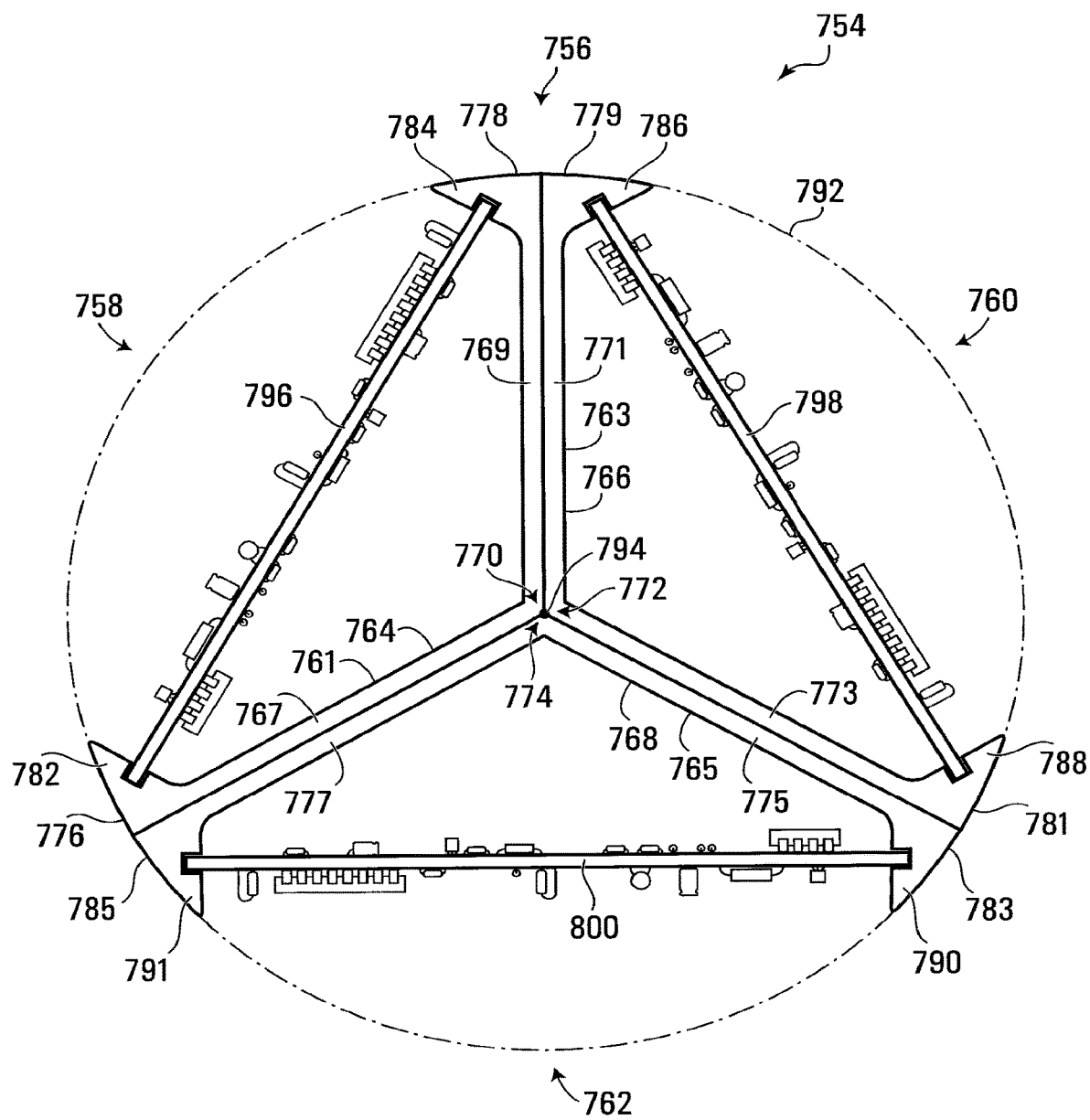
FIG. 12 is an end view of a first-level component holder assembly employing the component mounting apparatus shown in FIG. 11.

Referring to FIG. 12, a first-level component holder assembly employing the component mounting apparatus 730 shown in FIG. 11 is shown generally at 754. The assembly 754 includes a first-level mounting assembly 756 similar to the first-level mounting assembly 300 described above in connection with FIG. 9, but including first, second, and third apparatuses 758, 760 and 762 each generally the same as the apparatus 730 described above in connection with FIG. 11, connected together back to back. The apparatuses 758, 760 and 762 include respective first and second parallel spaced apart component holders 782, 784, 786, 788, 790, and 791 holding respective rigid components 796, 798, and 800. The apparatuses 758, 760 and 762 also include supports 764, 766, and 768 connecting together the respective component holders 782, 784, 786, 788, 790, and 791, the supports having respective connecting portions 761, 763, and 765 and connecting interfaces 767, 769, 771, 773, 775, and 777 having flat surfaces which are abutting. Because the connecting portions 761, 763, and 765 of the respective supports 764, 766, and 768 include respective central vertices 770, 772, and 774, there is no circular cylindrical space for receiving a component within the component holder assembly 754.

In this embodiment, the lengths of the connecting portions 761, 763, and 765 and the connecting interfaces 767, 769, 771, 773, 775, and 777 are selected such that outer surfaces 776, 778, 779, 781, 783, and 785 of the first and second component holders 782, 784, 786, 788, 790, and 791 are coincident with a circle 792 having a centre 794 coincident with the central vertices 770, 772, and 774 of the connecting portions 761, 763, and 765. This enables the assembly 754 to be received in a circular cylindrical enclosure having an inner wall surface (not shown) of equal or greater diameter relative to the diameter of the circle 792.

Figure 13:
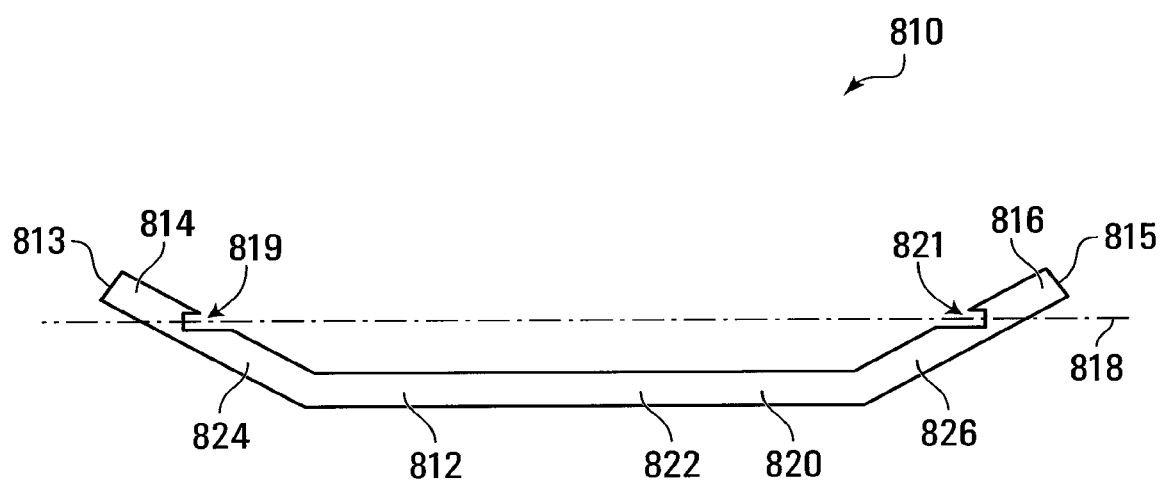
FIG. 13 is an end view of a component mounting apparatus according to a fifth embodiment of the invention.

Referring now to FIG. 13, a component mounting apparatus according to a fifth embodiment of the invention is shown generally at 810. The apparatus 810 is similar to but not identical to the apparatus 10 described above in connection with FIGS. 1-4. The apparatus 810 comprises a first body 812, having first and second component mounts 813 and 815. In the embodiment shown, the first and second component mounts 813 and 815 include first and second parallel spaced apart component holders 814 and 816 respectively disposed in and defining a common plane 818 and connected together by a support 820 having a connecting portion 822. The first and second component holders 814 and 816 are generally the same as those described above in connection with FIGS. 1 through 4 and include respective receptacles 819 and 821 for holding portions of a rigid component (not shown) such that the rigid component is spaced apart from the support 820. The support 820 also has connecting interfaces 824 and 826 having flat surfaces. The connecting interfaces 824 and 826 may be similar to the connecting interfaces 42 and 44 of the apparatus 10 described above having regard to FIGS. 1-4. In the embodiment shown in FIG. 13, the apparatus 810 differs from the apparatus 10 shown in FIGS. 1-4 in at least that the connecting portion 822 is planar rather than curved.

Figure 14:
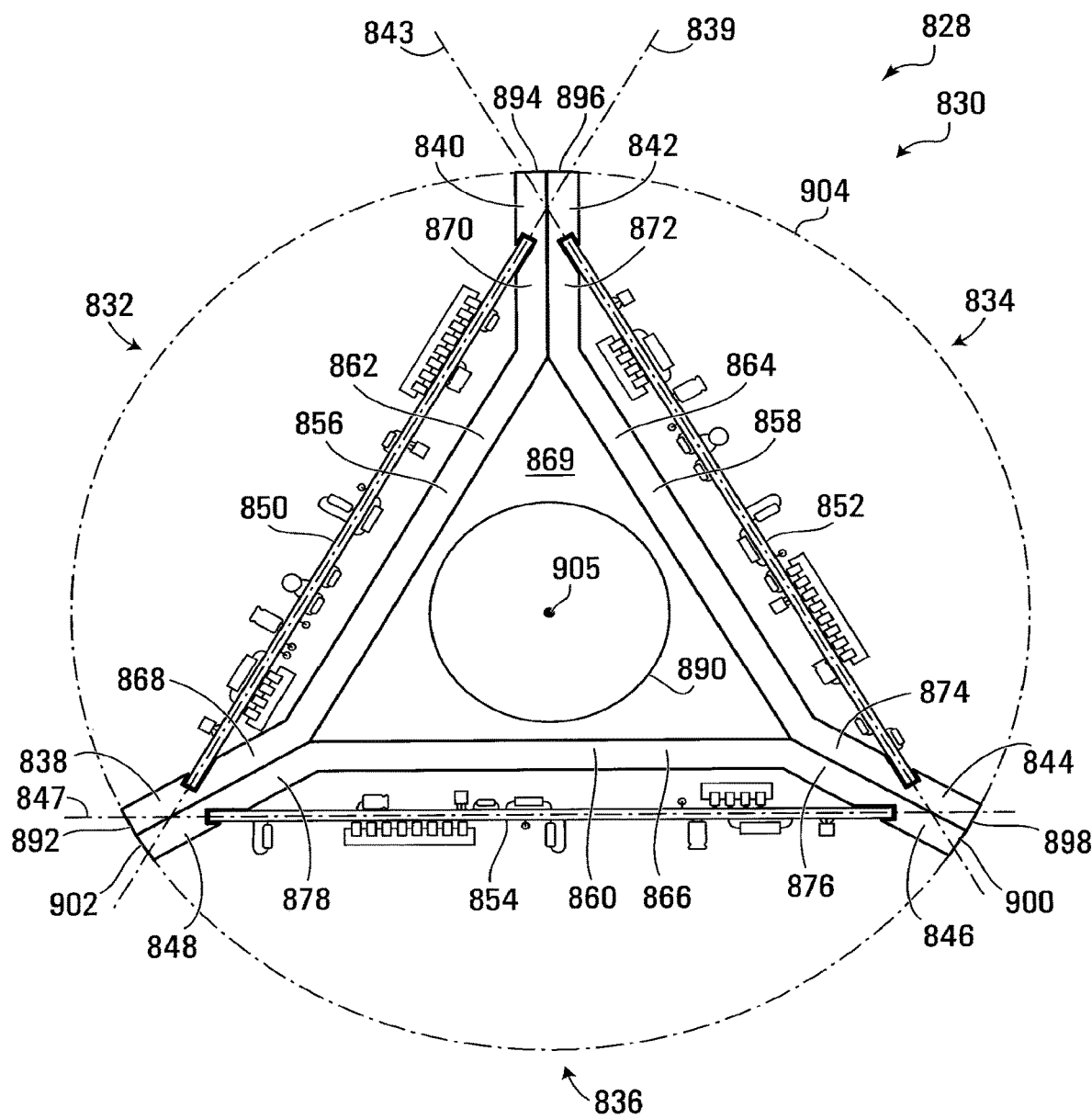
FIG. 14 is an end view of a first-level component holder assembly employing the component mounting apparatus shown in FIG. 13.

Referring to FIG. 14, a first-level component holder assembly employing the component mounting apparatus 810 shown in FIG. 13 is shown generally at 828. The assembly 828 includes a first-level mounting assembly 830 similar to the first-level mounting assembly 300 described above in connection with FIG. 9, but including first, second, and third apparatuses 832, 834 and 836 each generally the same as the apparatus 810 described above in connection with FIG. 13, connected together back to back. The apparatuses 832, 834 and 836 include respective first and second parallel spaced apart component holders 838, 840, 842, 844, 846, and 848 disposed in and defining respective common planes 839, 843, and 847 holding respective rigid components 850, 852, and 854 such that axial planes of the rigid components 850, 852, and 854 are coincident with the common planes 839, 843, and 847 respectively. The apparatuses 832, 834 and 836 also include supports 856, 858, and 860 connecting together the respective component holders 838, 840, 842, 844, 846, and 848, the supports having respective planar connecting portions 862, 864, and 866 and connecting interfaces 868, 870, 872, 874, 876 and 878 having flat surfaces which are abutting. The common planes 839, 843, and 847 are spaced apart from the connecting portions 862, 864, and 866, respectively, to create space between the rigid components 850, 852, and 854 and the supports 856, 858, and 860 to permit components such as electronic or electrical components to be mounted on inwardly facing sides of the rigid components 850, 852, and 854.

The planar connecting portions 862, 864, and 866 are spaced apart from one another to form a space 869 between the connecting portions 862, 864, and 866. A component 890 such as a battery or a capacitor bank, for example, may be received and held in the space 869.

The lengths of the connecting portions 862, 864, and 866 and the connecting interfaces 868, 870, 872, 874, 876 and 878 are selected such that outer surfaces 892, 894, 896, 898, 900, and 902 of the component holders 838, 840, 842, 844, 846, and 848 are coincident with a circle 904 having a centre 905 coincident with a centre of the space 869. This enables the assembly 828 to be received in a circular cylindrical enclosure having an inner wall surface (not shown) of equal or greater diameter relative to the diameter of the circle 904.

Figure 15:
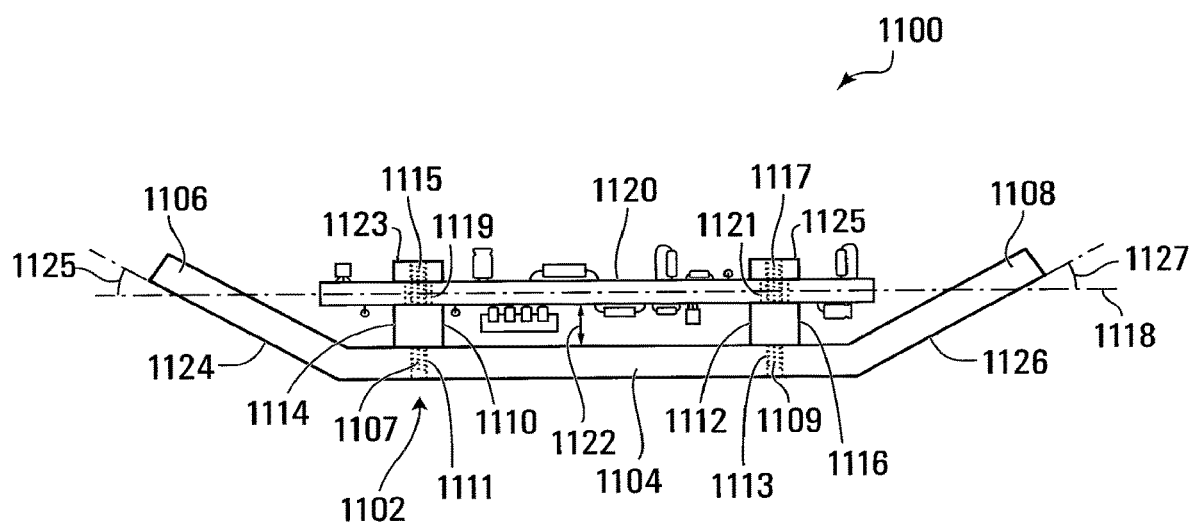
FIG. 15 is an end view of a component holder assembly employing a component mounting apparatus according to a sixth embodiment of the invention.

Referring now to FIG. 15, a component holder apparatus employing a mounting apparatus 1102 according to a sixth embodiment of the invention is shown generally at 1100. The apparatus 1102 is similar to but not identical to the apparatus 810 described above in connection with FIG. 13. In the embodiment shown, the apparatus 1102 includes a first support 1104 and first and second connecting interfaces 1106 and 1108 extending on opposite lateral sides of the first support. The apparatus 1102 also includes first and second component mounts 1110 and 1112 on said first support 1104. Although, in the embodiment shown, the first and second components mounts 1110 and 1112 are on the first support 1104, in another embodiment, the first and second component mounts may be on the first and second connecting interfaces respectively (see for example FIG. 1). The apparatus 1102 differs from the apparatus 810 at least in that the first and second component mounts 1110 and 1112 include a plurality of standoffs rather than first and second component holders described in earlier embodiments. For ease of explanation only, first and second standoffs 1114 and 1116 of the plurality of standoffs are shown, it being understood that they represent the plurality of standoffs.

The first and second standoffs 1114 and 1116 define a mounting plane 1118 spaced apart from the first support 1104 and are operable to hold a rigid component 1120 in the mounting plane 1118. In the embodiment shown, the standoffs 1114 and 1116 include respective threaded portions 1107 and 1109 corresponding to threaded openings 1111 and 1113 in the first support 1104 and the standoffs 1114 and 1116 are connected to the first support by the threaded portion being received in the threaded opening. In another embodiment, the first and second standoffs 1114 and 1116 may be connected to the first support 1104 by an adhesive. In the embodiment shown, the first and second standoffs 1114 and 1116 have threaded studs 1115 and 1117 that pass through openings 1119 and 1121 in the rigid component 1120. Corresponding threaded members 1123 and 1125 (e.g. nuts) are threaded onto the threaded studs 1115 and 1117 from an outwardly facing side of the rigid component 1120. Alternatively the standoffs 1114 and 1116 may have threaded openings to which corresponding openings in the rigid component 1120 may be aligned to receive screws therethrough to secure the rigid component 1120 to the standoffs. In another embodiment, the standoffs 1114 and 1116 may be connected to the rigid component 1120 by an adhesive.

The first and second standoffs 1114 and 1116 are dimensioned to provide a space 1122 between the rigid component 1120 and the support 1104 where components mounted on the underside of the rigid component 1120 can be positioned. A plurality of pairs of standoffs like the first and second standoffs 1114 and 1116 may be spaced apart such that each pair is longitudinally spaced apart along the length of the apparatus 1102. The pairs of standoffs may be spaced apart by about 2 inches for example but the spacing, number and positioning of the standoffs is not critical and can be set as required to properly hold a rigid component to the apparatus 1102 in such a way that the apparatus with the rigid component mounted thereto can be used in the desired application.

The first and second connecting interfaces 1106 and 1108 are generally similar to the first and second connecting interfaces 42 and 44 described above with respect to FIG. 2. The first and second connecting interfaces 1106 and 1108 have first and second connecting surfaces 1124 and 1126 disposed at negative and positive angles 1125 and 1127, respectively, to the mounting plane 1118. In the embodiment shown, the negative and positive angles 1125 and 1127 are about −30 degrees and about +30 degrees, respectively. In other embodiments positive and negative angles similar to the positive and negative angles 1127 and 1125 may be between 0 and +90 degrees and between 0 and −90 degrees respectively. The first and second connecting surfaces 1124 and 1126 are operable to connect the apparatus 1102 to an adjacent similar apparatus, for example, as shown in FIG. 16.

Figure 16:
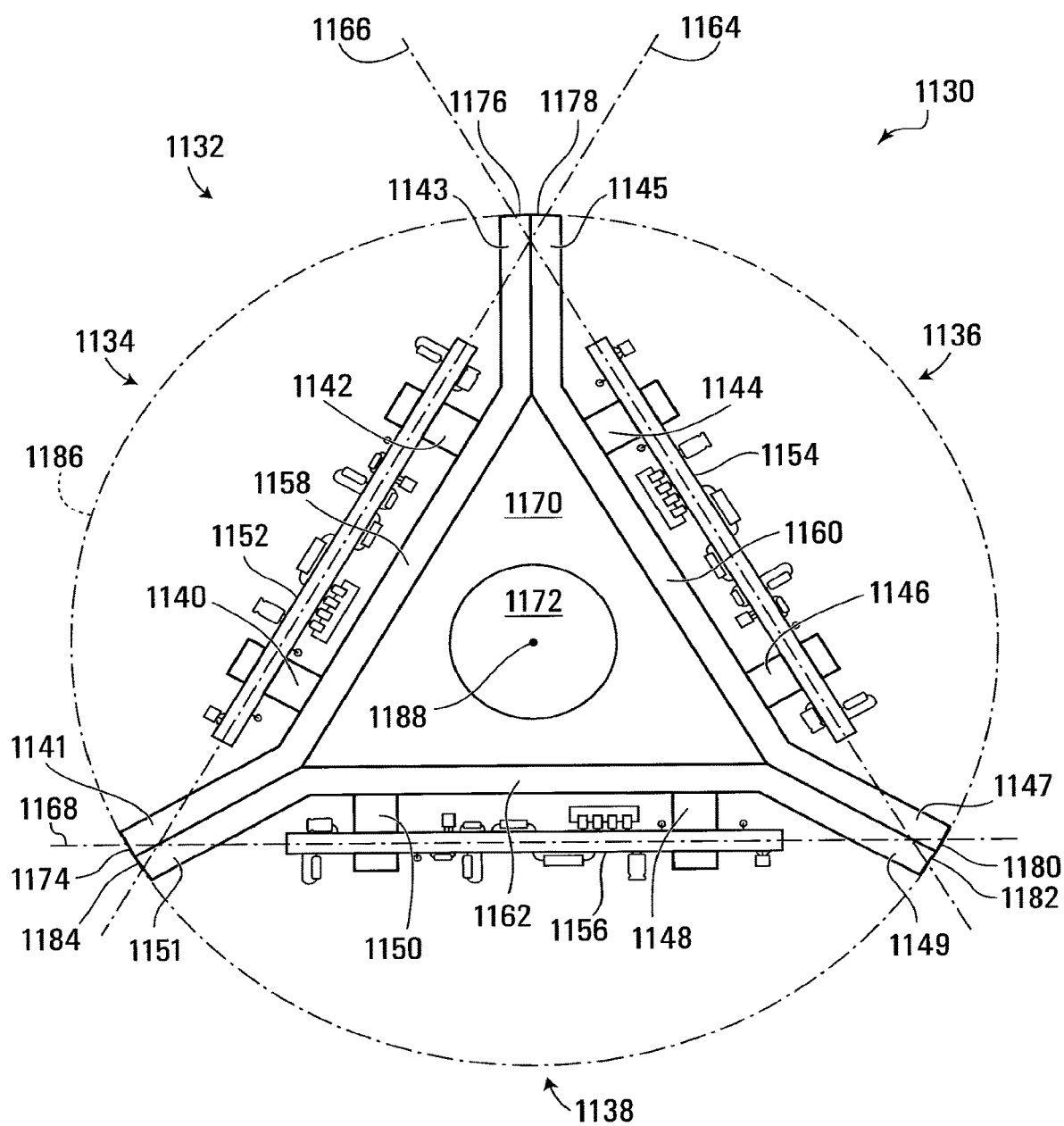
FIG. 16 is an end view of a first-level component holder assembly employing the component mounting apparatus shown in FIG. 15.

Referring to FIG. 16, a first-level component holder assembly employing the component mounting apparatus 1102 shown in FIG. 15 is shown generally at 1130. The assembly 1130 comprises a first-level mounting assembly 1132 similar to the first-level mounting assembly 300 described above in connection with FIG. 9, but including first, second, and third apparatuses 1134, 1136, and 1138 each generally the same as the apparatus 1102 described above in connection with FIG. 15, connected together back to back. The apparatuses 1134, 1136, and 1138 include supports 1158, 1160 and 1162 and first and second standoffs 1140, 1142, 1144, 1146, 1148, and 1150 on said supports 1158, 1160 and 1162. The standoffs 1140, 1142, 1144, 1146, 1148, and 1150 define mounting planes 1164, 1166, and 1168 spaced apart from the supports 1158, 1160 and 1162 and hold respective rigid components 1152, 1154, and 1156 in the mounting planes 1164, 1166, and 1168. The apparatuses 1134, 1136, and 1138 also include connecting interfaces 1141, 1143, 1145, 1147, 1149, and 1151 extending on opposite lateral sides of the supports 1158, 1160 and 1162.

The mounting planes 1164, 1166, and 1168 are spaced apart from the supports 1158, 1160 and 1162, respectively, to permit components such as electronic or electrical components to be mounted on inwardly facing sides of the rigid components 1152, 1154, and 1156.

The supports 1158, 1160 and 1162 are spaced apart from one another to form a space 1170 between the supports 1158, 1160 and 1162. A component 1172 such as a battery or a capacitor bank, for example, may be received and held in the space 1170.

The connecting interfaces 1141, 1143, 1145, 1147, 1149, and 1151 have first and second distal surfaces 1174, 1176, 1178, 1180, 1182, and 1184 respectively. The lengths of the supports 1158, 1160 and 1162 and the connecting interfaces 1141, 1143, 1145, 1147, 1149, and 1151 are selected such that the first and second distal surfaces 1174, 1176, 1178, 1180, 1182, and 1184 will lie on a circle 1186 having a center 1188 coincident with a longitudinal center of the assembly 1130. This enables the assembly 1130 to be received in a circular hollow cylindrical enclosure having an inner wall surface (not shown) of equal or greater diameter relative to the diameter of the circle 1186.

It will be appreciated that other first-level component holder assemblies may be provided where the lengths of the supports and the connecting interfaces and the angles of the connecting interfaces allow for any number of apparatuses similar to the apparatuses 10, 160, 162, 530, 532, 730, 810, and 1102 described in FIGS. 1-15 above to be connected together back to back.

Figure 17:
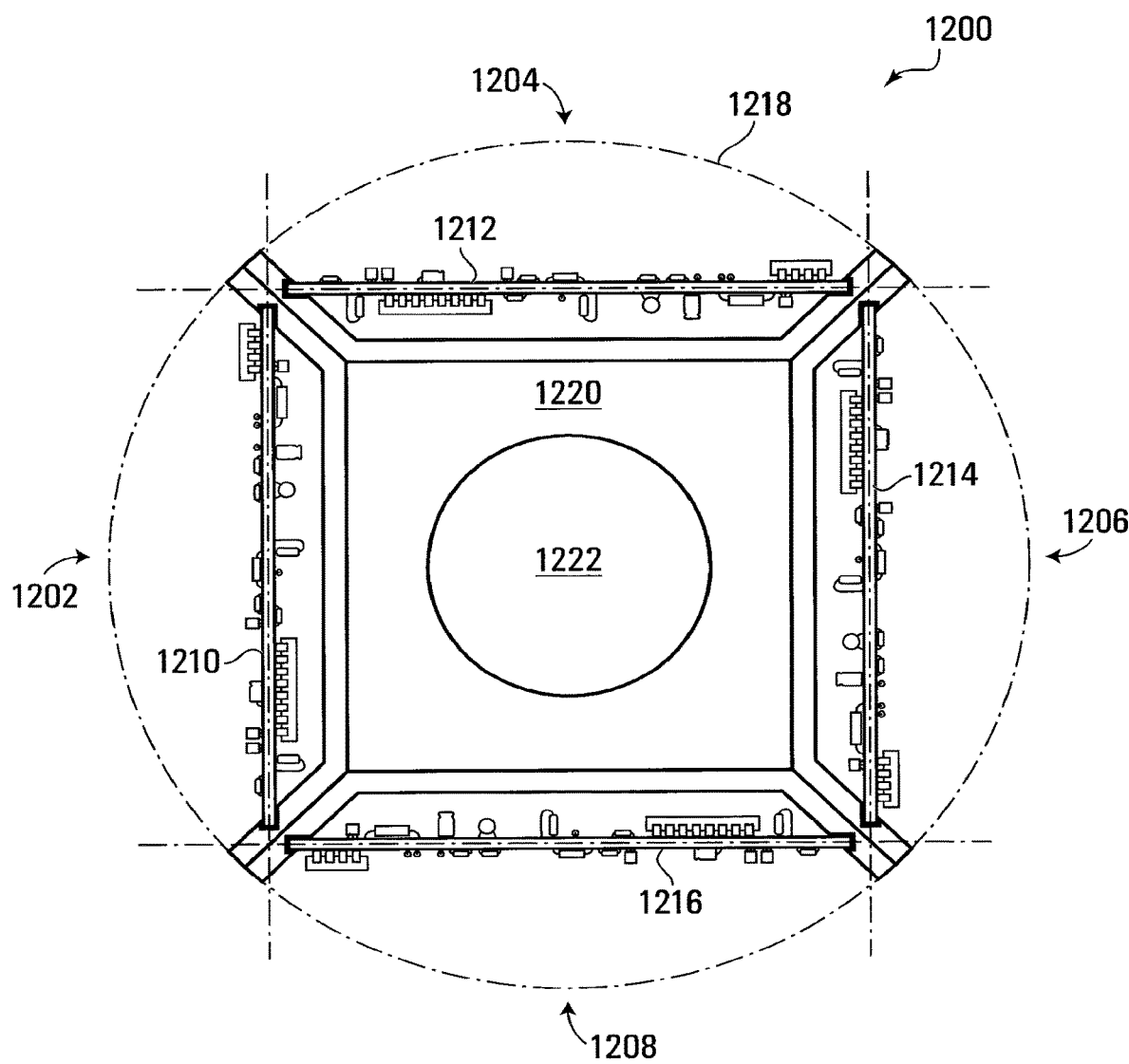
FIG. 17 is an end view of a first-level component holder assembly employing a mounting apparatus according to a seventh embodiment of the invention.

For example, referring to FIG. 17, a first-level component holder assembly employing a component mounting apparatus according to a seventh embodiment is shown generally at 1200. The assembly 1200 is generally similar to the assembly 828 described above in connection with FIG. 14 but has four apparatuses 1202, 1204, 1206 and 1208, similar to the apparatuses 832, 834 and 836 shown in FIG. 14, connected back to back. In the embodiment shown in FIG. 17, the assembly 1200 differs from the assembly 828 shown in FIG. 14 in at least that the angles between the component holding planes and the connecting interfaces are different. In this embodiment, the angles between the component holding planes and the connecting interfaces are about 45 degrees, and angles between adjacent component holding planes are each about 90 degrees. In other embodiments, angles between adjacent component holding planes may be different and may depend on the number of rigid components to be held. The apparatuses 1202, 1204, 1206 and 1208 hold respective rigid components 1210, 1212, 1214, and 1216 and are dimensioned such that outer surfaces of the component holders or connecting interfaces of the assembly 1200 lie on a circle 1218. Thus the assembly 1200 can be received in a circular cylindrical enclosure having an inner wall surface (not shown) of equal or greater diameter relative to the diameter of the circle 1218. The assembly 1200 includes a space 1220 for holding a rigid component 1222 between the apparatuses 1202, 1204, 1206 and 1208.

Figure 18:
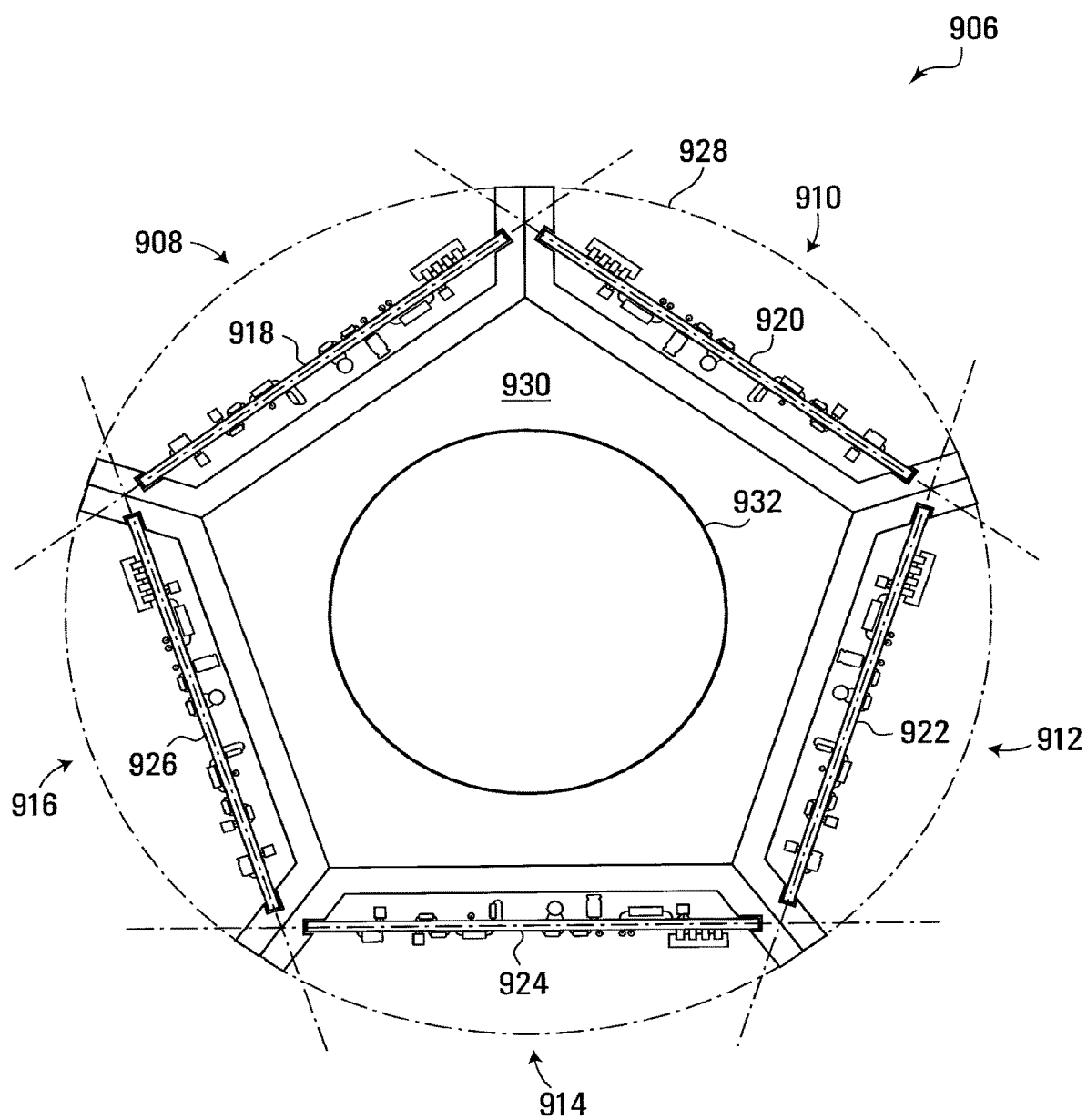
FIG. 18 is an end view of a first-level component holder assembly employing a mounting apparatus according to an eighth embodiment of the invention.

Referring to FIG. 18, a first-level component holder assembly employing a component mounting apparatus according to an eighth embodiment is shown generally at 906. The assembly 906 is generally similar to the assembly 828 described above in connection with FIG. 14 but has five apparatuses 908, 910, 912, 914 and 916, similar to the apparatuses 832, 834 and 836 shown in FIG. 14, connected back to back, but with different angles between the component holding planes and the connecting interfaces. In this embodiment, the angles between the component holding planes and the connecting interfaces are about 54 degrees, and angles between adjacent common planes are each about 108 degrees. The apparatuses 908, 910, 912, 914 and 916 hold respective rigid components 918, 920, 922, 924, and 926 and are dimensioned such that outer surfaces of the component holders of the assembly 906 lie on a circle 928. Thus the assembly 906 can be received in a circular cylindrical enclosure having an inner wall surface (not shown) of equal or greater diameter relative to the diameter of the circle 928. The assembly 906 includes a space 930 holding a rigid component 932 between the apparatuses 908, 910, 912, 914 and 916.

Figure 19:
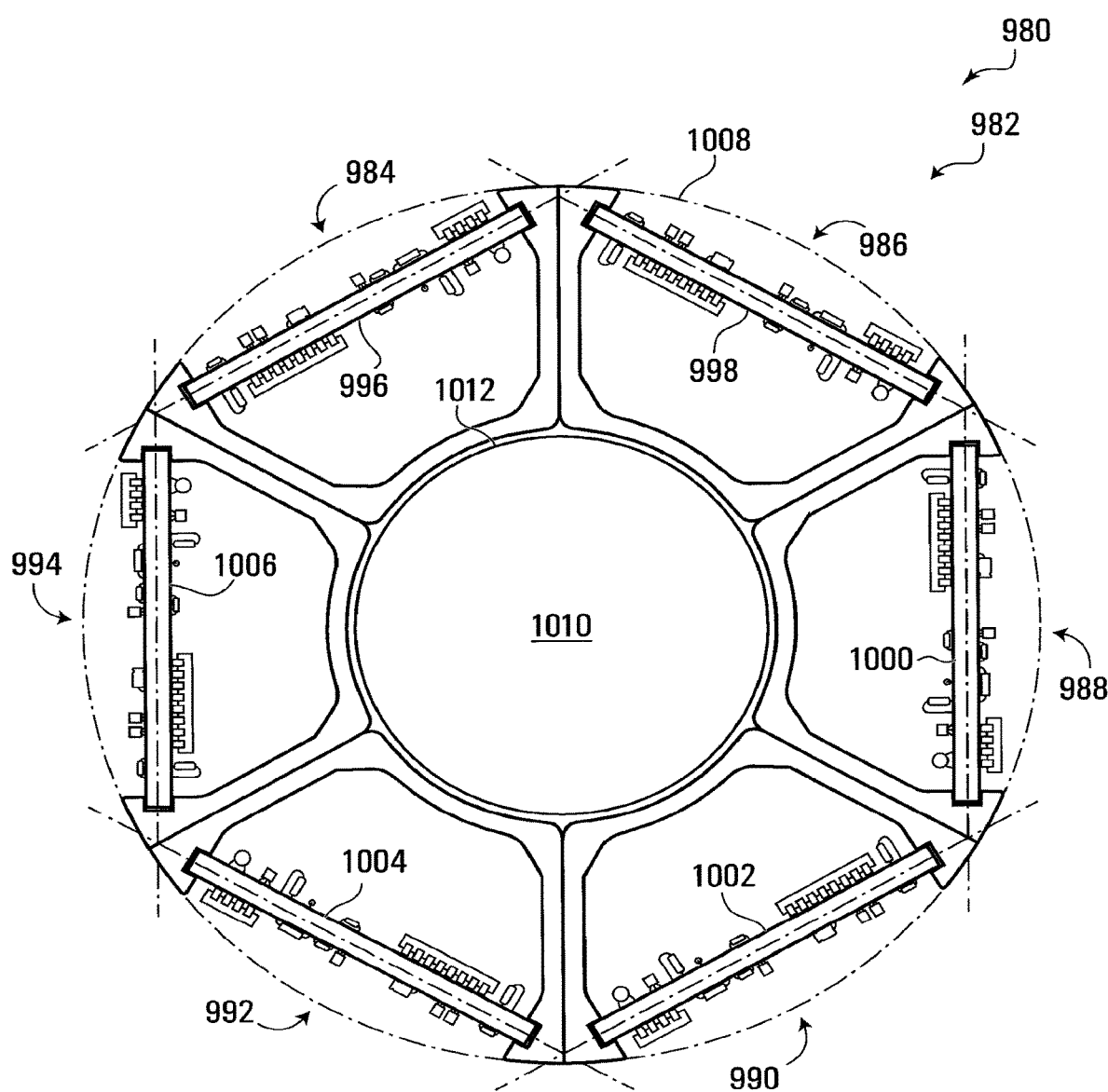
FIG. 19 is an end view of a first-level component holder assembly employing a mounting apparatus according to a ninth embodiment of the invention.

Referring to FIG. 19, a first-level component holder assembly employing a component mounting apparatus according to a ninth embodiment is shown generally at 980. The assembly 980 includes a component mounting assembly 982 generally similar to the assembly 300 described above in connection with FIG. 9 but having six apparatuses 984, 986, 988, 990, 992, and 994, similar to the apparatuses 302, 304 and 306 shown in FIG. 9, connected, back to back, each with angles between the common planes and the connecting interfaces of 30 degrees. In the embodiment shown, the angle between adjacent common planes is 120 degrees. The apparatuses 984, 986, 988, 990, 992, and 994 hold respective rigid components 996, 998, 1000, 1002, 1004, and 1006 and are dimensioned such that outer surfaces of the component holders of the assembly 980 lie on a circle 1008. Thus the assembly 980 can be received in a circular cylindrical enclosure having an inner wall surface (not shown) of equal or greater diameter relative to the diameter of the circle 1008. The assembly 980 includes a space 1010 holding a rigid component 1012 between the apparatuses 984, 986, 988, 990, 992, and 994.

Figure 20:
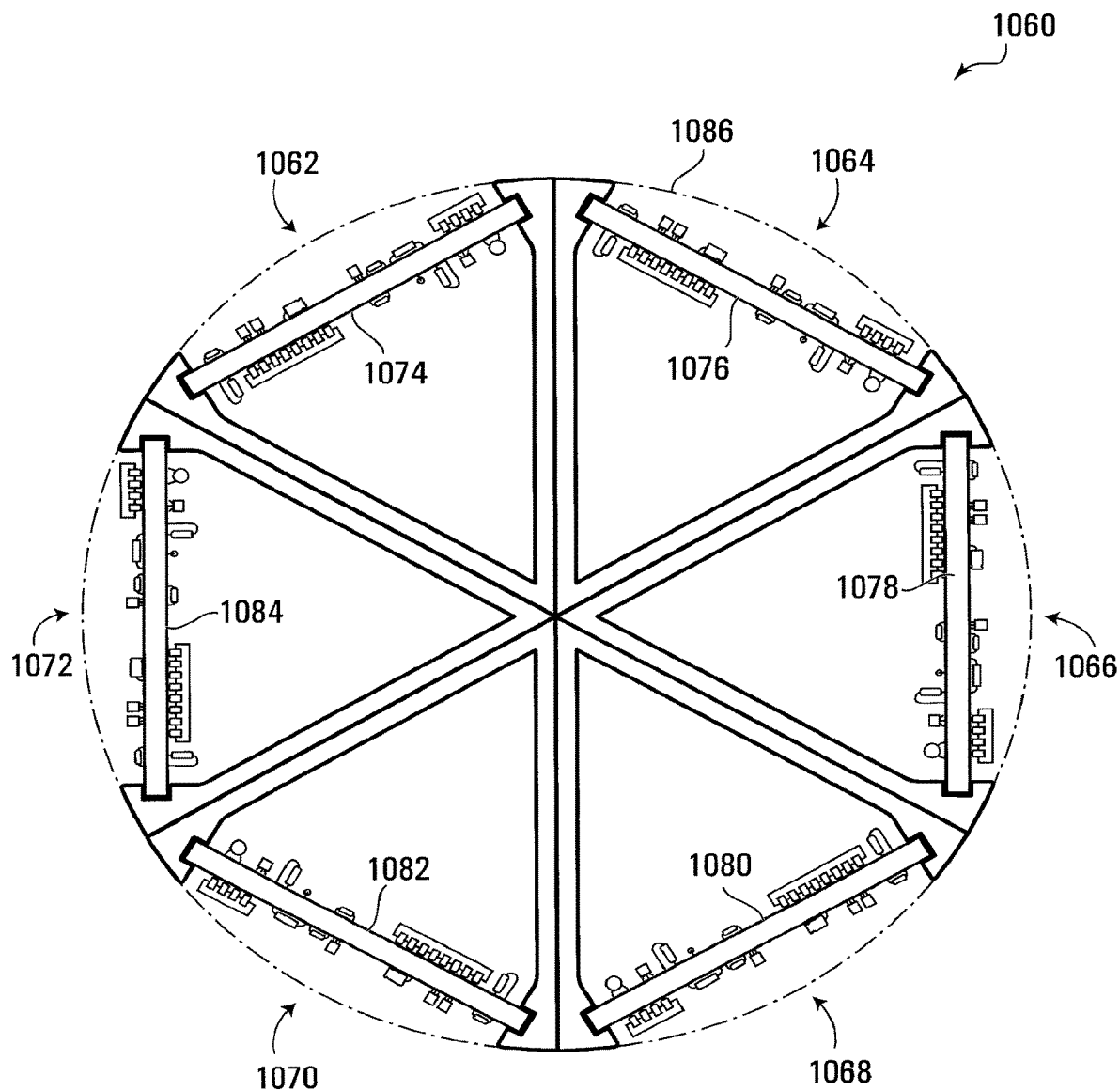
FIG. 20 is an end view of a first-level component holder assembly employing a mounting apparatus according to a tenth embodiment of the invention.

Referring to FIG. 20, a first-level component holder assembly employing a component mounting apparatus according to a tenth embodiment is shown generally at 1060. The assembly 1060 is generally similar to the assembly 754 described above in connection with FIG. 12 but having six apparatuses 1062, 1064, 1066, 1068, 1070, and 1072, similar to the apparatuses 758, 760, 762 shown in FIG. 12, connected, back to back, each with angles between the common planes and the connecting interfaces of 30 degrees. The apparatuses 1062, 1064, 1066, 1068, 1070, and 1072 hold respective rigid components 1074, 1076, 1078, 1080, 1082, and 1084 and are dimensioned such that outer surfaces of the component holders of the assembly 1060 lie on a circle 1086. Thus the assembly 1060 can be received in a circular cylindrical enclosure having an inner wall surface (not shown) of equal or greater diameter relative to the diameter of the circle 1086. Because of the inclusion of the central vertices of the apparatuses 1062, 1064, 1066, 1068, 1070, and 1072 the assembly 1060 does not include a space for holding a rigid component between the apparatuses.

Figure 21:
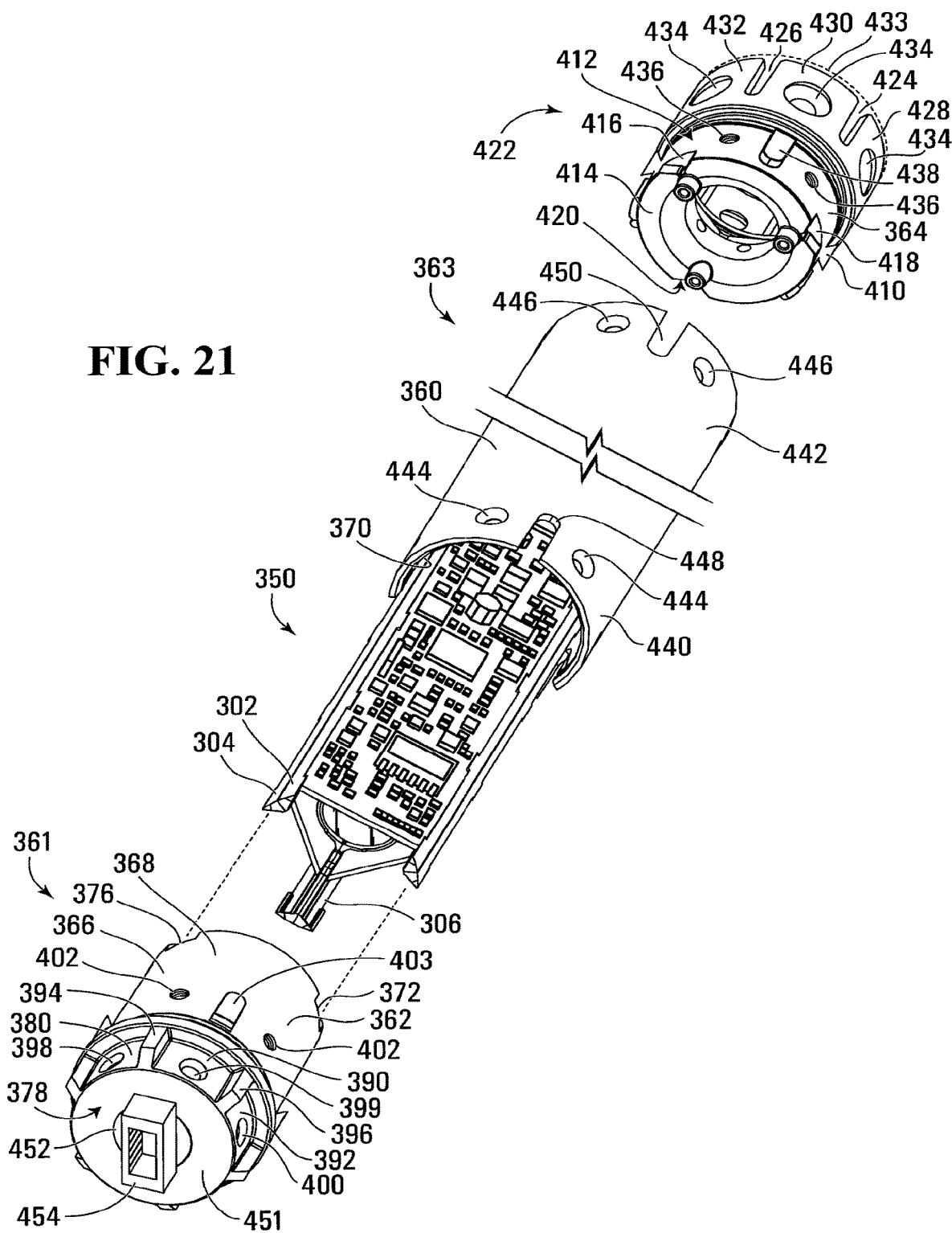
FIG. 21 is an exploded perspective view of a third-level component holder assembly employing a second-level component holder assembly employing the first-level component holder assembly shown in FIG. 10.

Any of the first-level component holder assemblies described may be mounted in a hollow cylindrical enclosure or tubular housing such as shown at 360 in FIG. 21 to form a second-level component holder assembly. In FIG. 21 the first-level component holder assembly 350 shown in FIG. 10 is depicted mounted in the hollow cylindrical enclosure 360 to form a second-level component holder assembly 361 comprising the first-level component holder assembly 350 and the hollow cylindrical enclosure 360. The hollow cylindrical enclosure 360 may be made of an insulating material such as a composite material, or a thermoplastic material, for example, or it may be made of a metallic material such as aluminum, for example. Strength, price, shock, transmission, and/or any need for electrically insulating properties may be design considerations for choosing the material to be used for the hollow cylindrical enclosure.

Referring to FIG. 21, while the first-level component holder assembly 350 may be mounted directly in the hollow cylindrical enclosure 360, the first-level component holder assembly 350 may be held more securely by using a first end mount 362 and optionally a second end mount 364, to form an alternate first-level component holder assembly.

Figure 23:
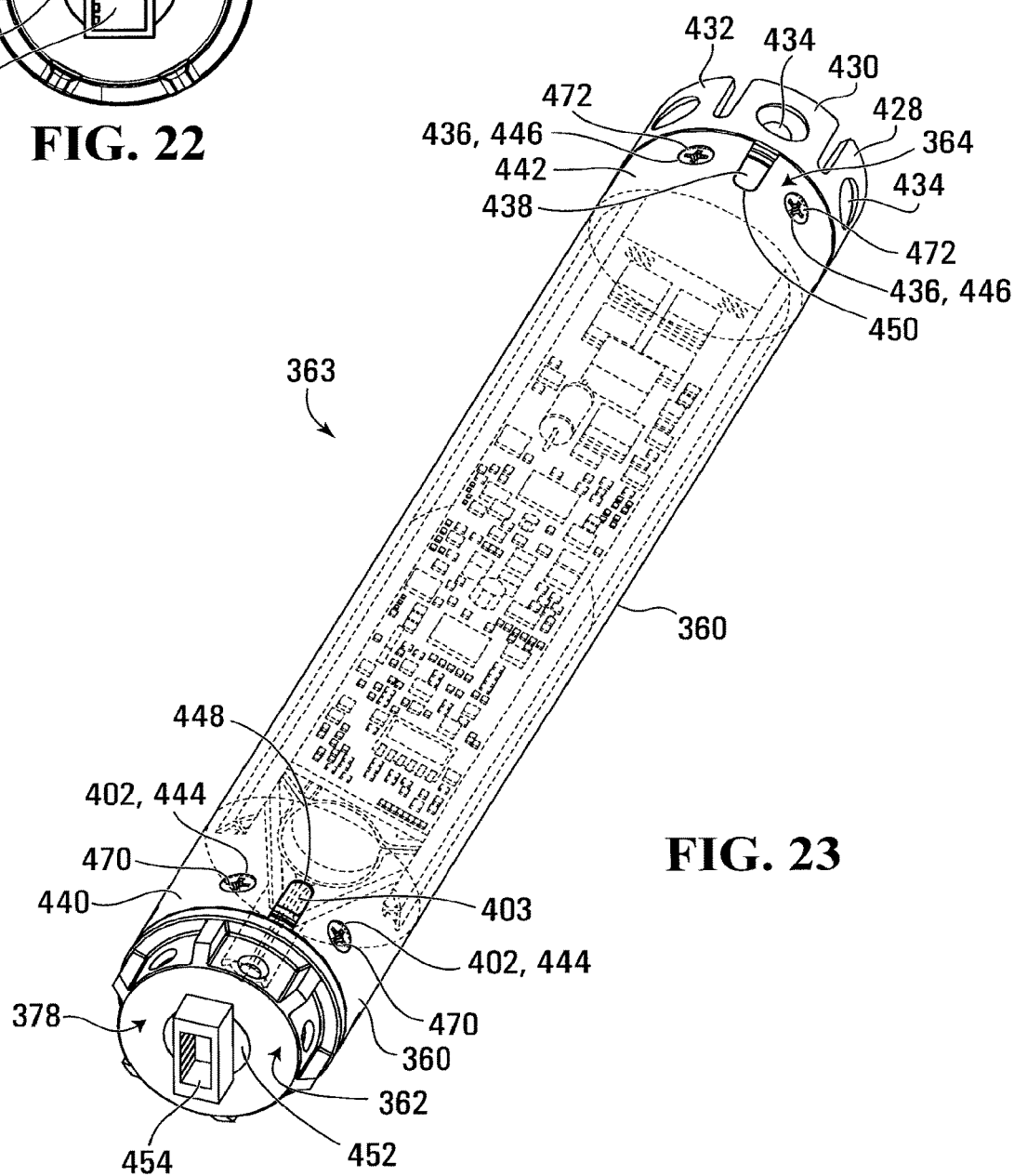
FIG. 23 is a perspective view of the third-level component holder assembly shown in FIG. 21.

In the embodiment shown in FIG. 21, the first-level component holder assembly 350 is held by the first and second end mounts 362 and 364 mounted in the hollow cylindrical enclosure 360 to form a third-level component holder assembly 363 as shown in FIG. 23. Referring back to FIG. 21, the first end mount 362 comprises a first mount body 366 having a surface portion 368 configured to be coincident with an inner surface 370 of the hollow cylindrical enclosure 360 when the first mount body 366 is received in the hollow cylindrical enclosure. The first mount body 366 further includes a first-level assembly connector, which, in this embodiment, is comprised of a plurality of receptacles, only two of which are shown at 372 and 376. The receptacles are operably configured to connect to the first and second component holders of at least one of the first, second and third mounting assemblies 302, 304, and 306 to secure the first-level component holder assembly 350 to the first mount body 366.

Figure 24:
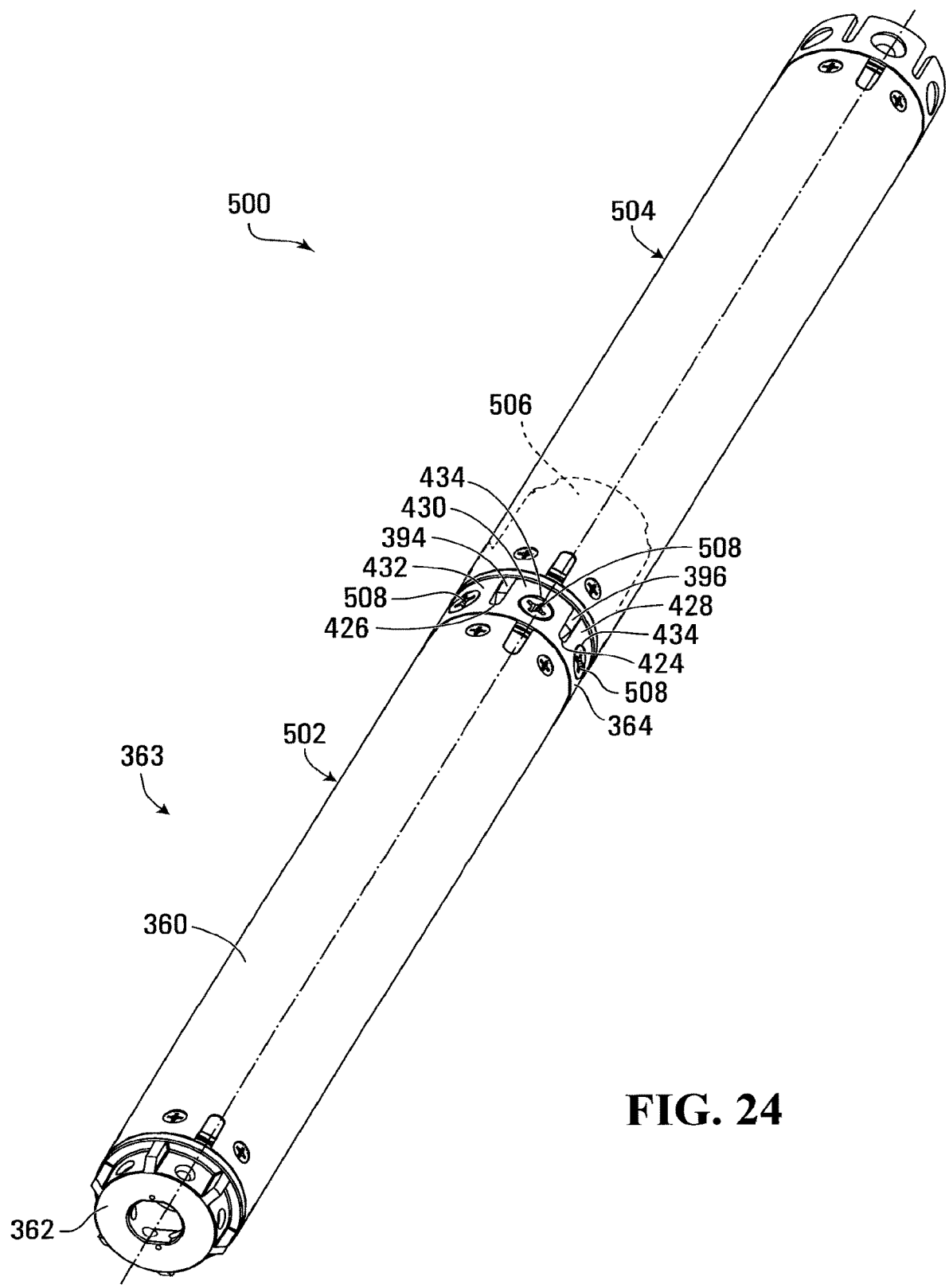
FIG. 24 is a perspective view of a fourth-level component holder assembly employing two of the third-level component holder assemblies shown in FIG. 23 coupled together.

The first mount body 366 further includes a first coupler shown generally at 378 operably configured to couple to a complementary coupler such as a second coupler shown at 422 in FIG. 21 which may be on an axially adjacent complementary mounting interface as seen in FIG. 24. In the embodiment shown, the first coupler 378 includes a plurality of arcuate surfaces 380, 390, 392 spaced apart by radial projections, only two of which are shown at 394 and 396. Openings 398, 399 and 400 are formed in the arcuate surfaces 380, 390, 392 respectively, to receive fasteners therein. In addition, the surface portion 368 has openings 402 also for receiving fasteners and has a first aligning projection 403 for keying the first end mount 362 in a predefined orientation relative to the hollow cylindrical enclosure 360. In one embodiment, the openings 398, 399, 400, and 402 are threaded openings for receiving threaded fasteners. Alternatively, the surface portion 368 may be adhesively secured, such as by epoxy for example, to the inner surface 370 of the hollow cylindrical enclosure 360.

Still referring to FIG. 21, the second end mount 364 includes a second mount body 410 having a surface portion 412 configured to be coincident with the inner surface 370 of the hollow cylindrical enclosure 360 and a second first-level assembly connector 414 having first, second and third receptacles 416, 418 and 420 for receiving the first end portions of the first and second component holders of at least one of the first, second and third mounting assemblies 302, 304, 306 to secure the first-level component holder assembly 350 to the second mount body 410. In addition, the second mount body 410 includes the second coupler shown generally at 422 operably configured to couple to a complementary coupler of an axially adjacent complementary mounting interface. The complementary coupler may be a first coupler of a first end mount of a longitudinally adjacent assembly, similar to the first coupler 378 of the first end mount 362.

The second coupler 422 includes a plurality of spaced apart axially extending arcuate projections, three of which are shown at 428, 430, and 432, disposed in spaced apart relation on a circle 433. Between the axially extending arcuate projections are axially extending openings, two of which are shown at 424 and 426. The axially extending arcuate projections 428, 430, and 432 and the axially extending openings 424, and 426 are configured to mate in a complementary way with the arcuate surfaces 380, 390 and 392 and the radial projections 394 and 396. The axially extending arcuate projections 428, 430, and 432 have non-threaded countersunk openings 434 that align with the openings 398, 399, 400 in the first mount body 366 when coupled thereto. In addition, the surface portion 412 has openings 436 for receiving a fastener and a second keying projection 438 for aligning the second end mount 364 in a pre-defined orientation relative to the hollow cylindrical enclosure 360. The openings 436 may be threaded openings for receiving a threaded fastener. Alternatively, the surface portion 412 may be adhesively secured, such as by epoxy for example, to the inner surface 370 of the hollow cylindrical enclosure 360.

The hollow cylindrical enclosure 360 has first and second end portions 440 and 442 having spaced apart countersunk openings 444 and 446 respectively. In addition, first and second keyways 448 and 450 are formed in the first and second end portions 440 and 442 to receive the first and second keying projections 403 and 438 respectively.

Figure 22:
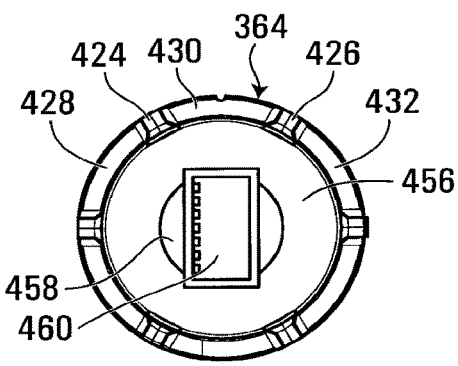
FIG. 22 is an end view of a second end mount of the third-level component holder assembly shown in FIG. 21.

In the embodiment shown in FIG. 21, the first coupler 378 has a first end surface 451, having a first opening 452 in which is installed an electrical connector 454. Wires from the electrical connector 454 may be connected to any of the circuit boards held by the first, second, and third mounting assemblies 302, 304, 306. Similarly, referring to FIG. 22 the second end mount 364 has a flat surface 456 in which is formed a second opening 458 in which is installed an electrical connector 460 complementary to the electrical connector 454 in the first end surface 451 of the first end mount 362. In this way, the first-level component holder assembly 350 held by the hollow cylindrical enclosure 360 can be connected to axially adjacent similar first-level component holder assemblies. Of course a non-complementary electrical connector or no connection at all, may alternatively be installed in the first or second opening 452 or 458.

Similar to the apparatus 10, the first and second mount bodies 366 and 410 may be unitary bodies. In one embodiment, the first and second mount bodies 366 and 410 may be formed from an electrically conductive material or an electrically insulating material, such as a thermoplastic.

Referring to FIG. 23, the third-level component holder assembly 363 shown in FIG. 21 is shown in completed form in which the first and second end mounts 362 and 364 are mounted in the first and second end portions 440 and 442 of the hollow cylindrical enclosure 360 and the first keying projection 403 is received in the first keyway 448 and the second keying projection 438 is received in the second keyway 450. Threaded fasteners 470 are received in the openings 444 and 402 and thereby secure the first end mount 362 to the first end portion 440 of the hollow cylindrical enclosure 360 to prevent relative rotation and longitudinal movement between the first end mount 362 and the hollow cylindrical enclosure 360. Similarly, threaded fasteners 472 are received through the openings 446 and 436 and secure the second end mount 364 to the hollow cylindrical enclosure 360 to prevent relative rotation and longitudinal movement. It will be appreciated that the end portions of the component holders of the first, second, and third mounting assemblies 302, 304 and 306 shown in FIG. 21 are received in the receptacles 372 and 376 and also in the first, second, and third receptacles 416, 418 and 420 and thereby prevent rotation of the assembly inside the hollow cylindrical enclosure 360. FIG. 23 therefore depicts the third-level component holder assembly 363 comprising the first-level component holder assembly 350 shown in FIG. 10, the first and second end mounts 362 and 364 for mounting the first-level component holder assembly in the hollow cylindrical enclosure 360 and the hollow cylindrical enclosure 360 itself.

Referring to FIG. 24, a fourth-level component holder assembly is shown generally at 500, and includes two third-level component holder assemblies similar to the third-level component holder assembly 363 shown in FIG. 23 coupled together. A first third-level component holder assembly is depicted generally at 502 comprising the third-level component holder assembly 363, and a second similar third-level component holder assembly having a similar configuration but possibly a different length and set of circuit boards held in the first-level component holder assembly within is depicted generally at 504. Here it can be seen that a first end mount 506 of the second third-level component holder assembly 504 is mechanically and electrically connected to the second end mount 364 of the first third-level component holder assembly 502 whereby, for example, the electrical connector shown at 460 in FIG. 22 of the second end mount 364 is connected to an electrical connector, similar to that shown at 454 in FIG. 10, of the first end mount 506 of the second third-level component holder assembly. In addition, screws such as shown at 508 are inserted through the openings 434 in the axially extending arcuate projections 428, 430, and 432 of the second end mount 364 of the first third-level component holder assembly and received in threaded openings, similar to those shown at 398, 399 and 400 in the first end mount 362 shown in FIG. 21, of the second third-level component holder assembly 504. Thus, the first and second third-level component holder assemblies 502 and 504 are electrically and mechanically connected together and are prevented from relative rotation and longitudinal movement by the screws 508 and by radial projections similar to those shown at 394 and 396 in the first end mount 506 of the second third-level component holder assembly being disposed in the axially extending openings 424 and 426 between the axially extending arcuate projections 428, 430, and 432 of the second end mount of the first third-level component holder assembly 502.

Figure 25:
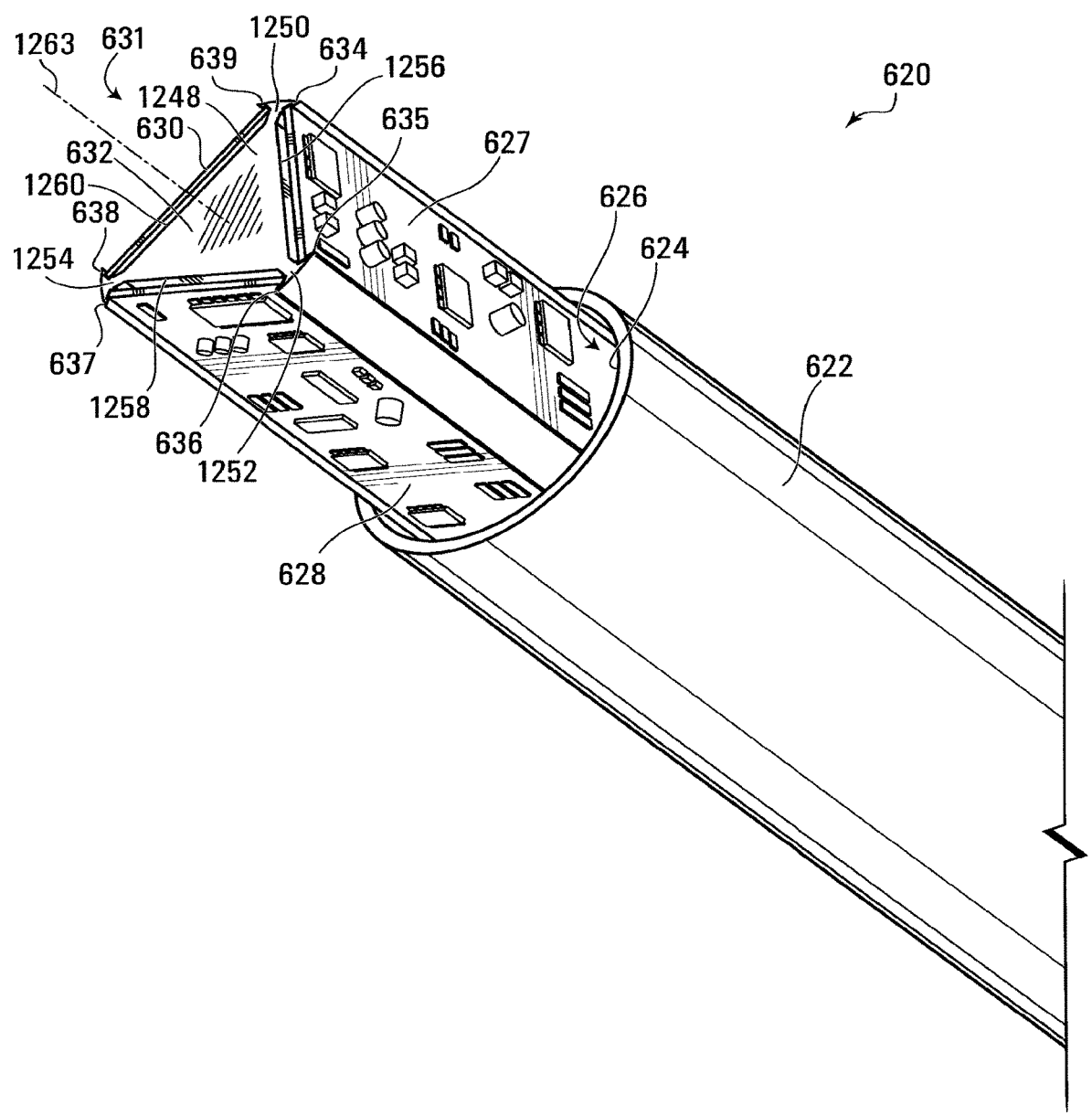
FIG. 25 is a perspective view of a component holder assembly employing a mounting apparatus according to an eleventh embodiment of the invention.

Referring now to FIG. 25, a component holder assembly employing a mounting apparatus according to an eleventh embodiment of the invention is shown generally at 620. The component holder assembly 620 includes an apparatus 631 for holding rigid components in a downhole bore or a downhole collar based application. The apparatus 631 includes an elongated body 632 including an elongated support 1248. The support 1248 includes a plurality of projections 1250, 1252, and 1254 and generally flat component mounting areas 1256, 1258, and 1260 disposed longitudinally parallel to a common longitudinal axis 1263 of the support 1248 and disposed between the projections. In the embodiment shown, the body 632 has a generally triangular cross-section.

Figure 26:
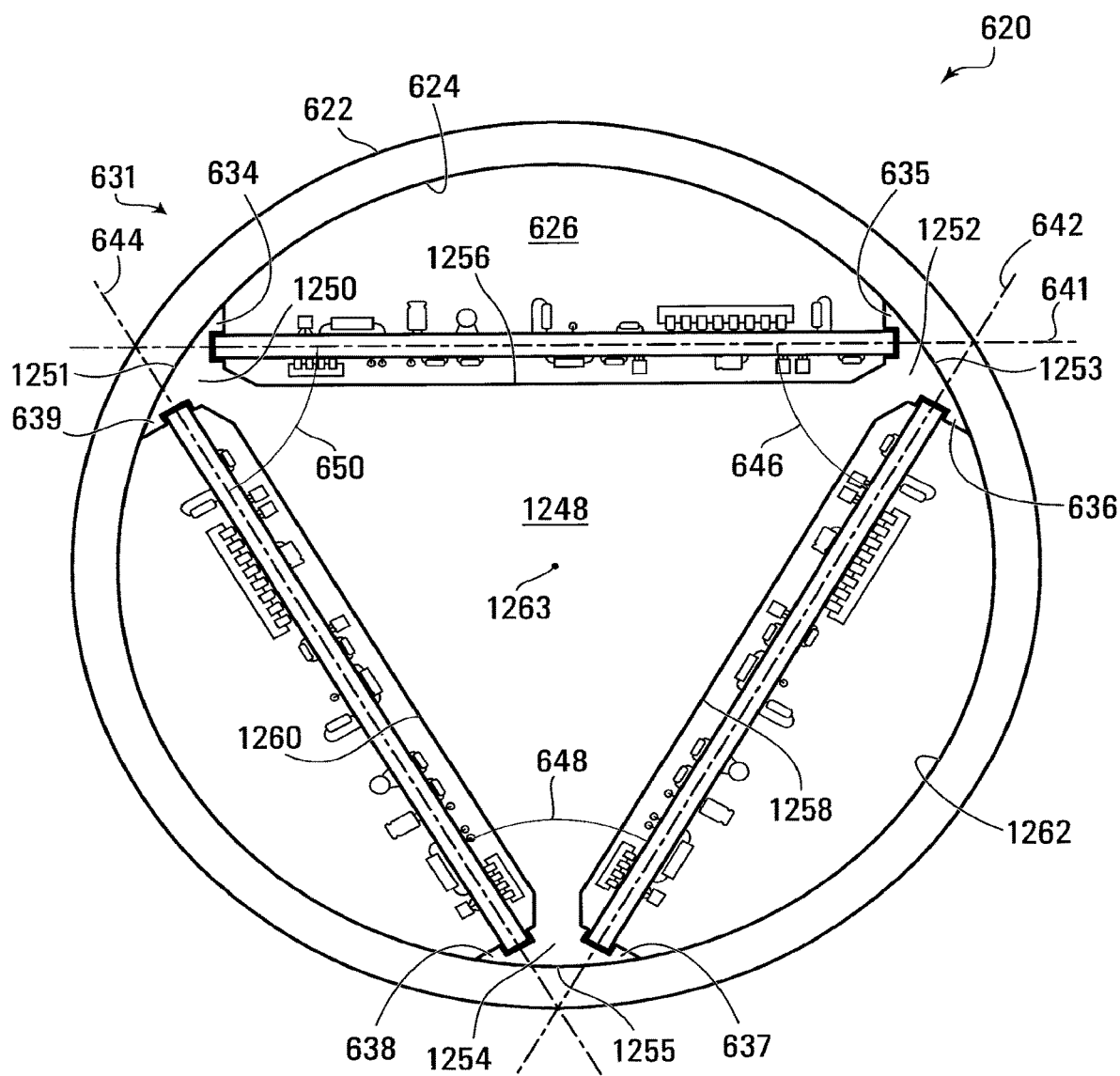
FIG. 26 is an end view of the component holder assembly shown in FIG. 25.

Referring to FIG. 26, the projections 1250, 1252, and 1254 have distal surfaces 1251, 1253, 1255 lying on a circle 1262 having a center coincident with the longitudinal axis 1263. In the embodiment shown, the apparatus 631 is disposed in a tubular housing or hollow cylindrical enclosure 622 having an inner cylindrical surface or wall 624 coincident with the circle 1262 and defining an internal volume 626 within the tubular housing 622. Accordingly, the distal surfaces 1251, 1253, 1255 of the projections 1250, 1252, and 1254 contact the inner cylindrical surface 624 to secure the assembly in the cylindrical enclosure. Referring back to FIG. 25, the apparatus 631 is shown partially out of the internal volume 626 for illustration purposes, but in operation, the apparatus 631 is entirely disposed within the internal volume 626. The body 632 includes a plurality of component mounts on the component mounting areas 1256, 1258, and 1260. In the embodiment shown, the component mounts include a plurality of pairs of parallel spaced apart component holders 634 and 635, 636 and 637, and 638 and 639, each pair generally similar to the first and second parallel spaced apart component holders 14 and 16 described above with reference to FIGS. 1 and 2. Each of the pairs of component holders 634 and 635, 636 and 637, and 638 and 639 holds a respective rigid component 627, 628, and 630 within the internal volume 626. The pairs of component holders 634-639 are connected together by the support 1248.

Referring to FIG. 26, each of the pairs of component holders 634-639 is disposed in and defines a respective mounting plane 641, 642, and 644 spaced apart from the respective mounting areas 1256, 1258, and 1260. The mounting planes 641, 642 and 644 are disposed at first, second and third angles 646, 648 and 650 to mounting planes defined by adjacent pairs of component holders. The mounting plane 641 of the pair of component holders 634 and 635 is disposed at the first angle 646 to the mounting plane 642 of the pair of component holders 636 and 637 adjacent to the pair of component holders 634 and 635. Similarly, the mounting plane 642 is disposed at the second angle 648 to the adjacent mounting plane 644 and the mounting plane 644 is disposed at the third angle 650 to the adjacent mounting plane 641. The first, second, and third angles 646, 648, and 650 are equal and are about 60 degrees in the embodiment shown where there are three of the pairs of component holders 634-639 for holding three rigid components in an equal spacing arrangement. In other embodiments, angles between adjacent mounting planes similar to the first, second, and third angles 646, 648, and 650 may be between 0 and 180 degrees.

Figure 27:
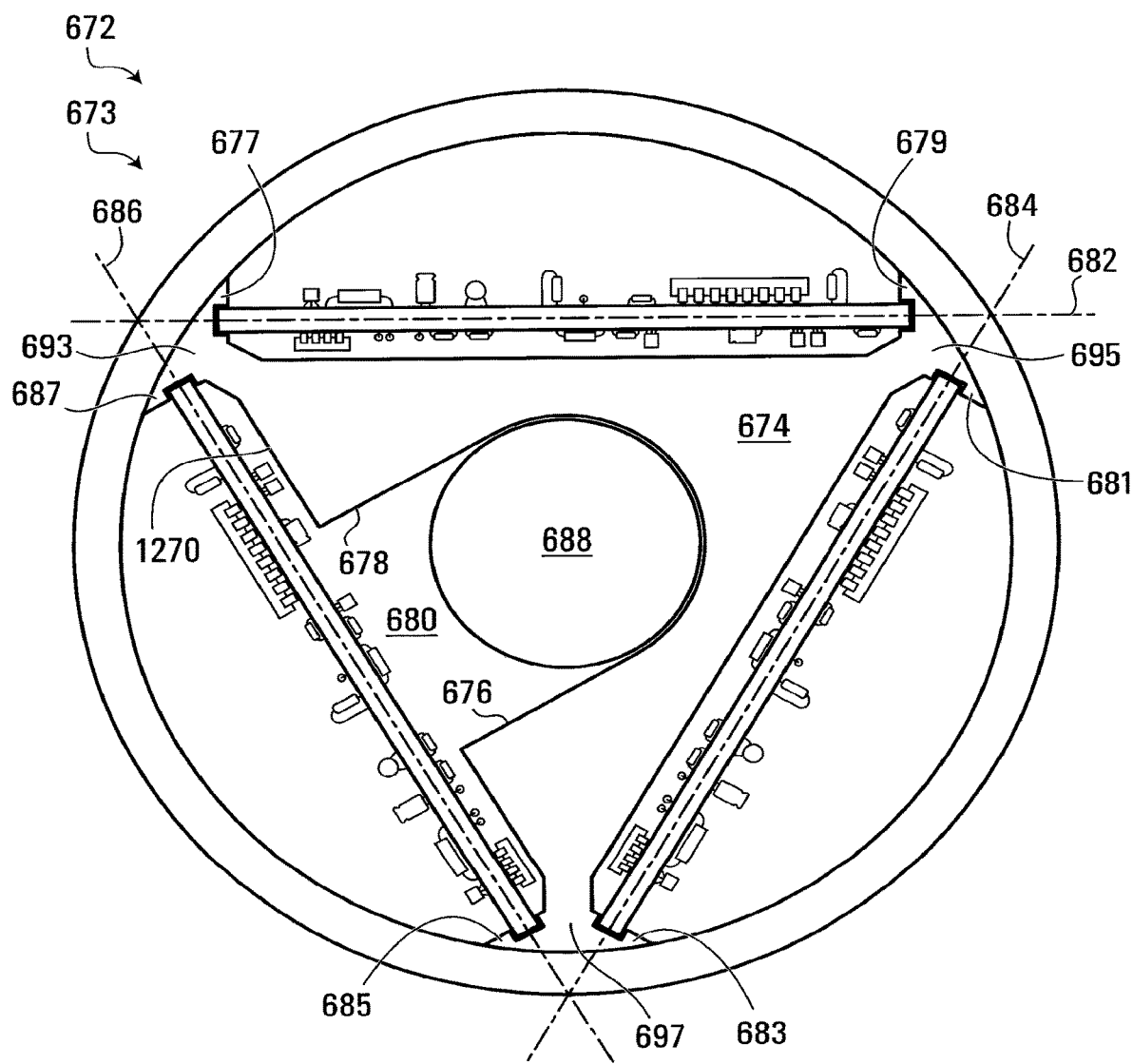
FIG. 27 is an end view of a component holder assembly employing a mounting apparatus according to a twelfth embodiment of the invention.

Referring to FIG. 27, a component holder assembly employing a mounting apparatus according to a twelfth embodiment of the invention is shown generally at 672. The assembly 672 includes an apparatus 673 similar to the apparatus 631 shown in FIGS. 25 and 26, except that a component mounting area 1270 of the apparatus 673 includes a longitudinal recess 676 defining a cylindrical recess extending longitudinally in the support for receiving and holding an inner rigid component 688. The apparatus 673 includes component mounts which include three pairs of component holders 677 and 679, 681 and 683, 685 and 687 disposed at distal ends of projections 693, 695 and 697 extending from the body. The pairs of component holders 677 and 679, 681 and 683, 685 and 687 are disposed in and define respective mounting planes 682, 684 and 686. Respective rigid components are held in the respective mounting planes 682, 684 and 686 by the respective pairs of component holders 677 and 679, 681 and 683, 685 and 687. The recess 676 is defined by an inner wall 678 that defines a cavity 680 in a central portion of the apparatus 673 between the mounting planes 682, 684 and 686. The cavity 680 provides a space for receiving and holding the inner rigid component 688 such as a battery or a capacitor, for example, and, if the apparatus is formed of a slightly flexible material, the cavity allows for flexing together two of the projections 693, 695 and 697.

Figure 28:
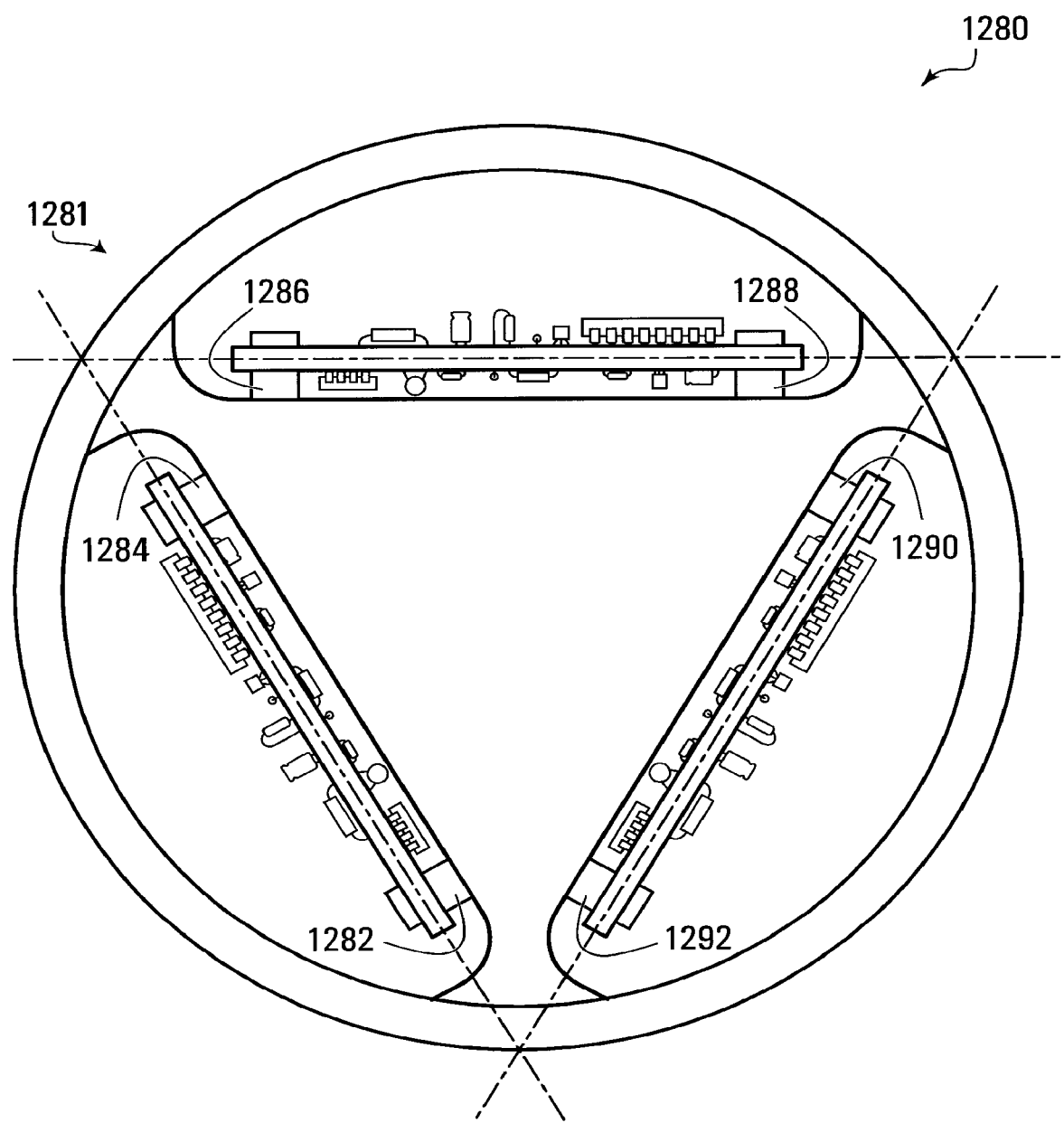
FIG. 28 is an end view of a component holder assembly employing a mounting apparatus according to a thirteenth embodiment of the invention.

Referring to FIG. 28, a component holder assembly employing a mounting apparatus according to a thirteenth embodiment of the invention is shown generally at 1280. The assembly 1280 includes a mounting apparatus 1281 similar to the apparatus 631 shown in FIGS. 25 and 26, except that component mounts of the assembly 1280 include standoffs 1282, 1284, 1286, 1288, 1290, and 1292 rather than the component holders shown in FIGS. 25 and 26. The standoffs 1282, 1284, 1286, 1288, 1290, and 1292 may be generally similar to the first and second standoffs 1114 and 1116 described above in connection with FIG. 15.

Figure 29:
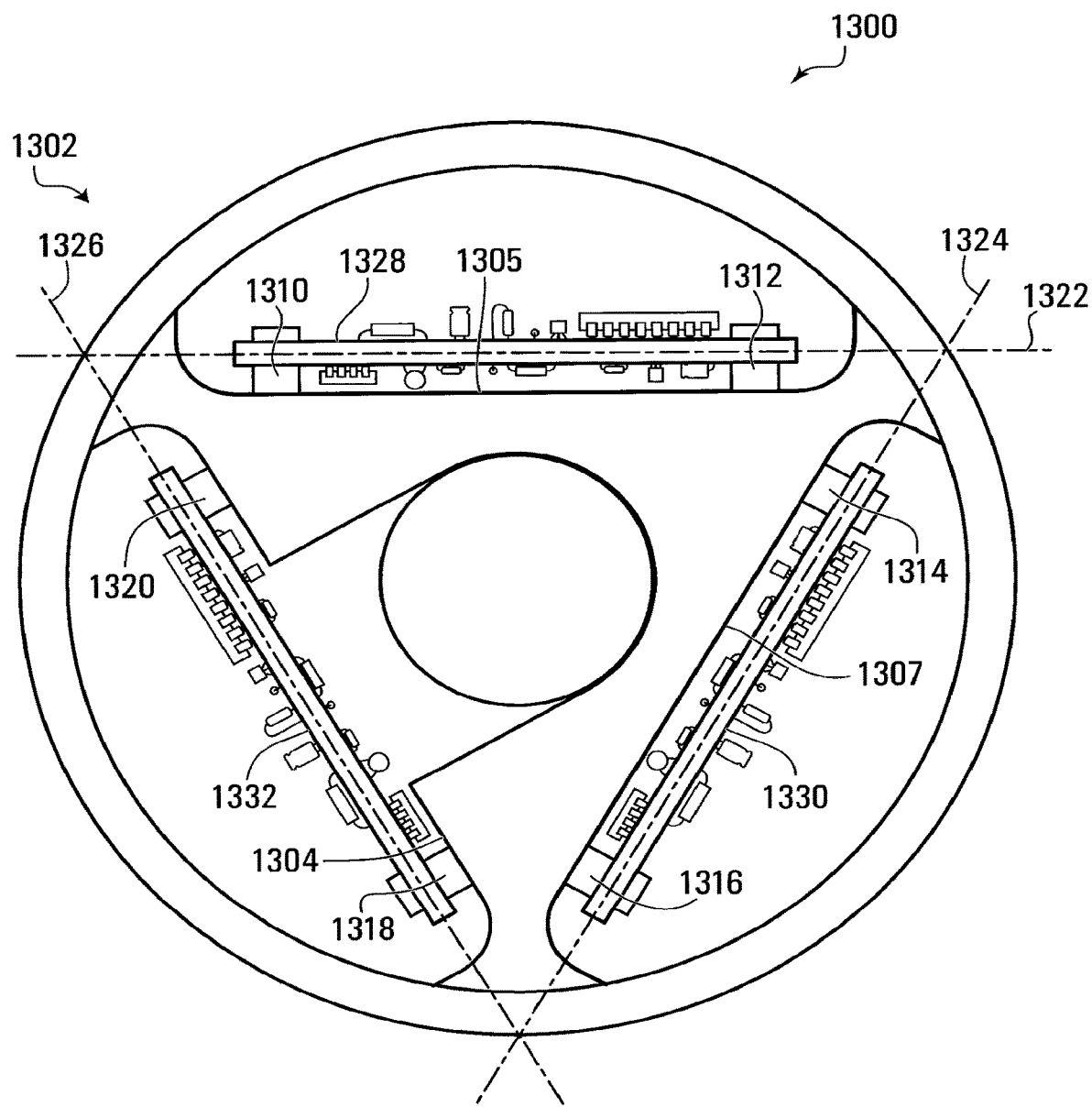
FIG. 29 is an end view of a component holder assembly employing a mounting apparatus according to a fourteenth embodiment of the invention.

Referring to FIG. 29, a component holder assembly employing a mounting apparatus according to a fourteenth embodiment of the invention is shown generally at 1300. The assembly 1300 includes an apparatus 1302 similar to the apparatus 673 shown in FIG. 27, except that instead of the component holders 677 and 679, 681 and 683, 685 and 687 shown in FIG. 27, standoffs 1310, 1312, 1314, 1316, 1318, and 1320 are provided on mounting areas 1304, 1305, and 1307 to define mounting planes 1322, 1324, and 1326 and to mount respective rigid components 1328, 1330 and 1332 respectively.

Figure 30:
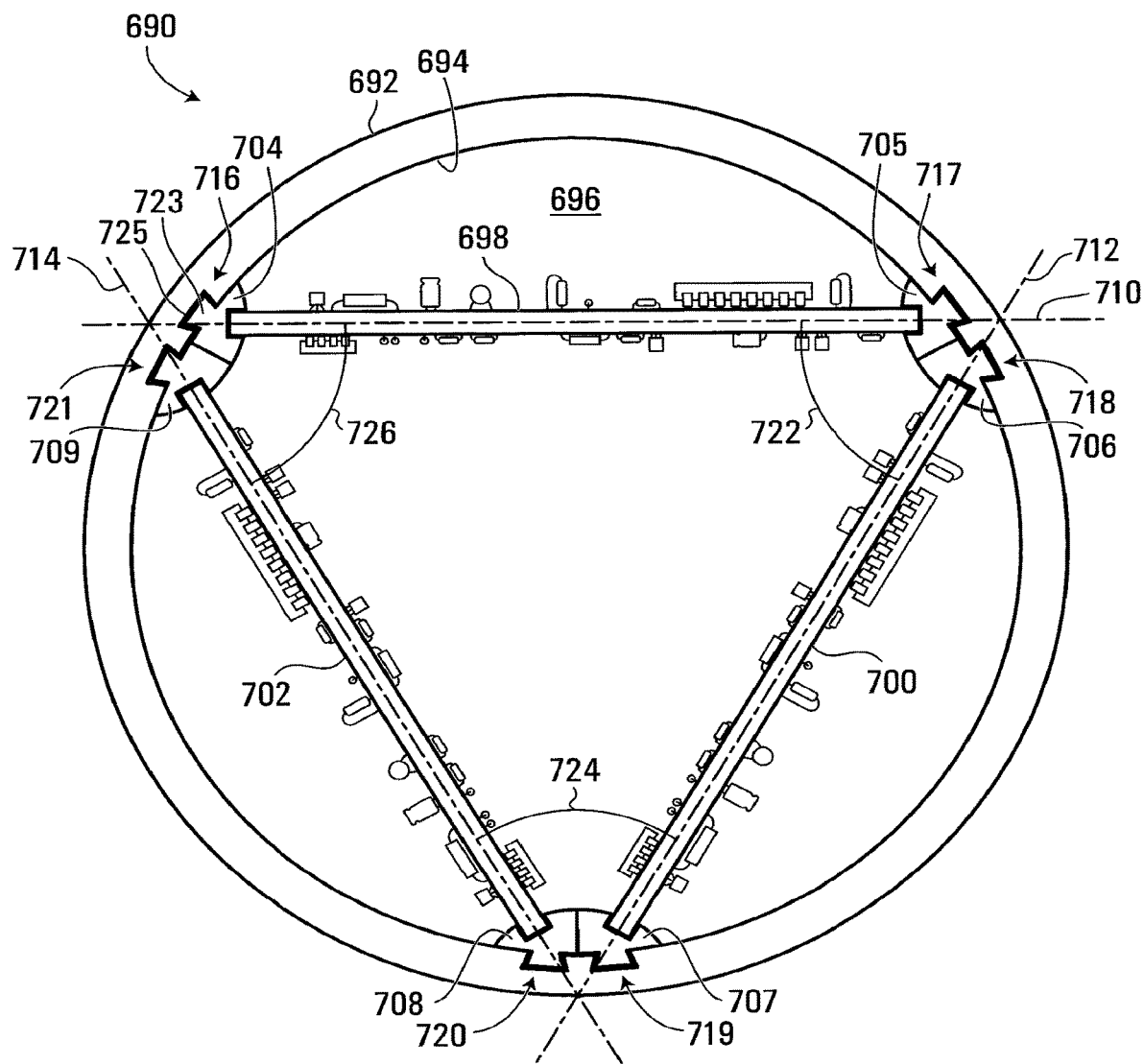
FIG. 30 is an end view of a component holder assembly employing a mounting apparatus according to a fifteenth embodiment of the invention.

Referring to FIG. 30, a component holder assembly employing a mounting apparatus according to a fifteenth embodiment of the invention is shown generally at 690. The component holder assembly 690 includes a tubular housing or hollow cylindrical enclosure 692 having an inner wall 694 defining an internal volume 696. The component holder assembly 690 also includes a plurality of rigid components 698, 700 and 702 and a plurality of pairs of parallel spaced apart component holders 704 and 705, 706 and 707, and 708 and 709 which are disposed in the internal volume 696. The pairs of component holders 704-709 are connected to the tubular housing 692 and are each disposed in and define a respective common plane 710, 712 and 714. Each of the pairs of component holders 704-709 holds a respective one of the rigid components 698, 700 and 702 within the internal volume 696. As described above having regard to the mounting planes 641, 642 and 644 in connection with FIG. 26, the common planes 710, 712 and 714 of the pairs of component holders 704-709 are disposed at angles 722, 724 and 726 to the common planes of adjacent ones of the pairs of component holders. In the embodiment shown in FIG. 30, there are three of the pairs of component holders 704 and 705, 706 and 707, and 708 and 709, equally spaced, and the angles 722, 724 and 726 are each about 60 degrees. However, it will be understood that any number of pairs of component holders may be similarly arranged in a component holder assembly similar to the component holder assembly 690 such that angles similar to the angles 722, 724 and 726 may be between about 0 degrees and about 180 degrees.

The component holder assembly 690 includes a plurality of holder connectors 716-721 for connecting the plurality of pairs of component holders 704-709 to the tubular housing 692. In one embodiment, the holder connectors 716-721 include sliding dovetail joints (only one of which is labeled 723) connected to the respective component holders 704-709 and slotted into respective complementary sockets (only one of which is labeled 725) in the inner wall 694 of the tubular housing 692. The tubular housing 692 thus acts as a support. In this embodiment, adjacent ones of the component holders 704-709 need not be connected together. However, in an alternative embodiment, the adjacent component holders 704-709 may be connected together.

Figure 31:
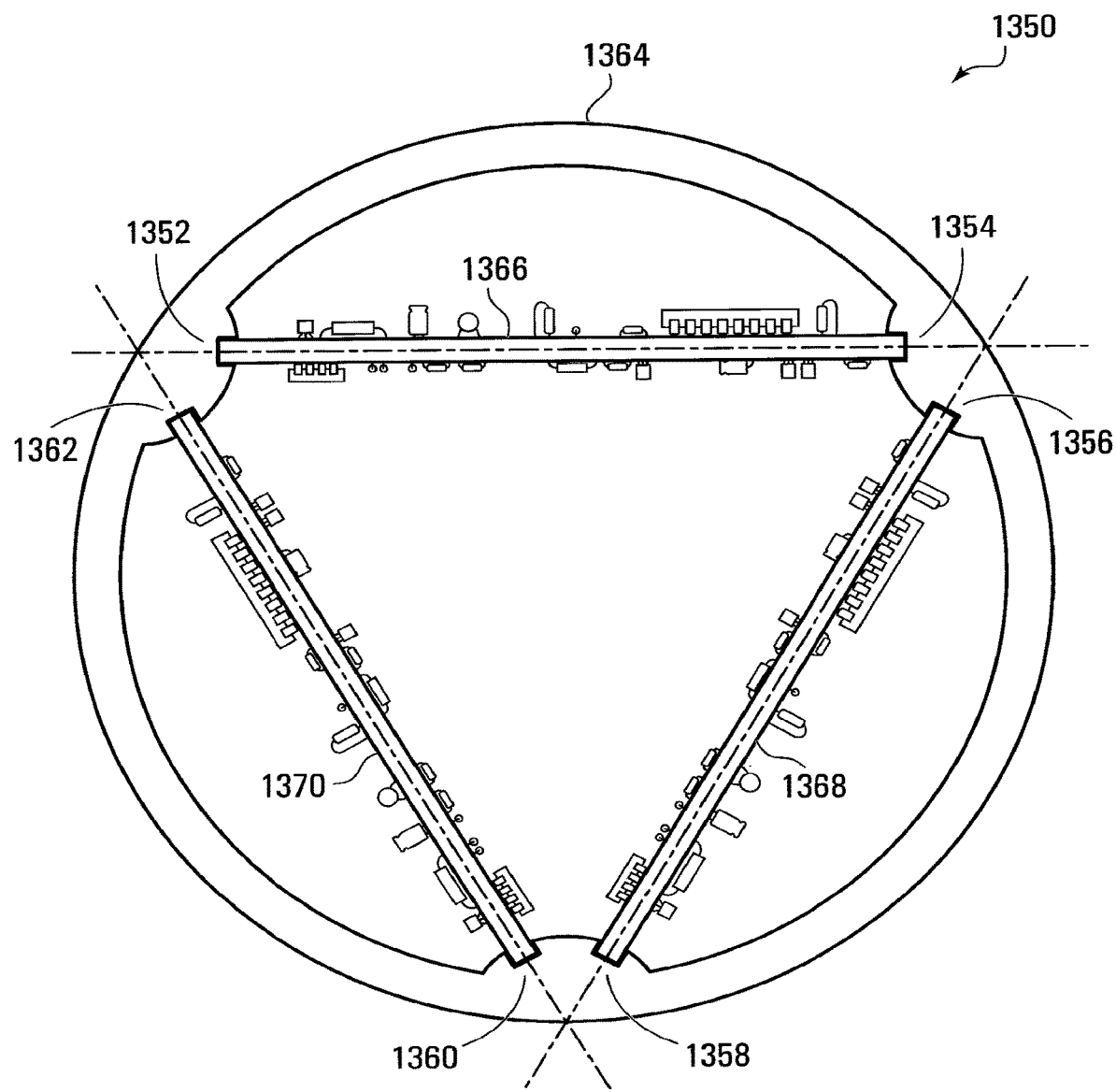
FIG. 31 is an end view of a component holder assembly employing a mounting apparatus according to a sixteenth embodiment of the invention.

Referring to FIG. 31, a component holder assembly employing a mounting apparatus according to a sixteenth embodiment of the invention is shown generally at 1350. The assembly 1350 is generally similar to the assembly 690 shown in FIG. 30, except that instead of the component holders 704-709 being separate bodies from the tubular housing 692, component holders 1352, 1354, 1356, 1358, 1360, and 1362 of the assembly 1350 are integral with a tubular housing 1364 of the assembly 1350. The component holders 1352, 1354, 1356, 1358, 1360, and 1362 allow rigid components 1366, 1368, and 1370 to be slid into the component holders axially.

Any of the component holder assemblies 620, 672, 1280, 1300, 690 and 1350 shown in FIGS. 25-31 may replace the component holder assembly comprising the first-level component holder assembly 350 mounted in the hollow cylindrical enclosure 360 as described in connection with the third-level and fourth-level component holder assemblies 363 and 500 described above.

It will be understood that any of the component mounts of the above described component holder apparatuses may comprise either standoffs or component holders or both standoffs and component holders.

Terms such as first-level, second-level, third-level, and fourth-level have been used herein to distinguish between various mounting and holder assemblies for the readers convenience. However these terms have been used for clarity only and will be understood as not limiting the disclosed embodiments.

While specific embodiments of the invention have been described and illustrated, such embodiments should be considered illustrative of the invention only and not as limiting the invention as construed in accordance with the accompanying claims.

What is claimed is:

1. A second-level component holder assembly comprising:
 a) a first-level component holder assembly comprising: i) a component mounting apparatus comprising: a body comprising first and second parallel spaced apart component holders disposed in a common plane and a support connecting the component holders together; and ii) a rigid component held by said first and second component holders; and
 b) a first end mount for mounting said first-level component holder assembly in a hollow cylindrical enclosure, wherein said first end mount comprises:
  i) a first mount body having:
   1) a surface portion configured to be coincident with an inner surface of said hollow cylindrical enclosure when said first mount body is received in said hollow cylindrical enclosure;
   2) a first first-level assembly connector operably configured to connect to said first and second component holders of the component mounting apparatus of said first-level component holder assembly to secure said first-level component holder assembly to said first mount body; and
   3) a first coupler operably configured to couple to a complementary coupler of an axially adjacent complementary mounting interface.

2. The second-level component holder assembly of claim 1 wherein said first coupler comprises:
 a) a plurality of radially and axially extending protrusions;
 b) a plurality of arcuate surfaces between said radially and axially extending protrusions;
 c) threaded openings in at least two of said arcuate surfaces for receiving respective threaded fasteners.

3. The second-level component holder assembly of claim 2 wherein said first coupler comprises a first end surface having a first opening.

4. The second-level component holder assembly of claim 3 further comprising a first electrical connector in said first opening.

5. The second-level component holder assembly of claim 1 further comprising a second end mount for mounting said first-level assembly in said hollow cylindrical enclosure.

6. The second-level component holder assembly of claim 5 wherein said second end mount comprises:
   a) a second mount body having
      i) a plurality of surface portions configured to be coincident with said inner surface of said hollow cylindrical enclosure when said second mount body is received in said hollow cylindrical enclosure;
      ii) a second first-level assembly connector operably configured to connect to said first and second component holders of the component mounting of said first-level component assembly to secure said first-level component holder assembly to said second mount body;
      iii) a second coupler operably configured to couple to a complementary coupler of an axially adjacent complementary mounting interface.

7. The second-level component holder assembly of claim 6 wherein said second coupler comprises:
   a) a plurality of spaced apart axially extending arcuate projections disposed in spaced apart relation on a circle; and
   b) openings in at least two of said arcuate projections for receiving respective threaded fasteners.

8. The second-level component holder assembly of claim 7 wherein said second coupler comprises a second end surface having a second opening.

9. The second-level component holder assembly of claim 8 further comprising a second electrical connector in said second opening.

10. The second-level component holder assembly of claim 6 wherein said first and second mount bodies are unitary bodies formed from an electrically insulating material.

11. A third-level component holder assembly comprising the second-level component holder assembly of claim 6 and a hollow cylindrical enclosure, wherein said first and second couplers are mounted to said hollow cylindrical enclosure to mount said second-level component holder assembly in said hollow cylindrical enclosure.

12. A fourth-level component holder assembly comprising:
   a) a first third-level component holder assembly according to claim 11; and
   b) a second third-level component holder assembly according to claim 11;
   wherein the first coupler of said first third-level component holder assembly is connected to the second coupler of said second third-level component holder assembly to join together said first and second third-level component holder assemblies.

13. A second-level component holder assembly comprising:
   a) a first-level component holder assembly comprising: i) a component mounting apparatus comprising: a body comprising first and second parallel spaced apart component holders disposed in a common plane and a support connecting the component holders together; and ii) a rigid component held by said first and second component holders;
   b) a first end mount for mounting said first-level component holder assembly in a hollow cylindrical enclosure; and
   c) a second end mount for mounting said first-level assembly in said hollow cylindrical enclosure, wherein said second end mount comprises:
      i) a second mount body having
         1) a plurality of surface portions configured to be coincident with said inner surface of said hollow cylindrical enclosure when said second mount body is received in said hollow cylindrical enclosure;
         2) a second first-level assembly connector operably configured to connect to said first and second component holders of the component mounting of said first-level component assembly to secure said first-level component holder assembly to said second mount body; and
         3) a second coupler operably configured to couple to a complementary coupler of an axially adjacent complementary mounting interface.

14. The second-level component holder assembly of claim 13 wherein said second coupler comprises:
   a) a plurality of spaced apart axially extending arcuate projections disposed in spaced apart relation on a circle; and
   b) openings in at least two of said arcuate projections for receiving respective threaded fasteners.

15. The second-level component holder assembly of claim 14 wherein said second coupler comprises a second end surface having a second opening.

16. The second-level component holder assembly of claim 15 further comprising a second electrical connector in said second opening.

17. The second-level component holder assembly of claim 13 wherein said first and second mount bodies are unitary bodies formed from an electrically insulating material.

18. A third-level component holder assembly comprising the second-level component holder assembly of claim 13 and a hollow cylindrical enclosure, wherein said first and second couplers are mounted to said hollow cylindrical enclosure to mount said second-level component holder assembly in said hollow cylindrical enclosure.

19. A fourth-level component holder assembly comprising:
   a) a first third-level component holder assembly according to claim 18; and
   b) a second third-level component holder assembly according to claim 18;
   wherein the first coupler of said first third-level component holder assembly is connected to the second coupler of said second third-level component holder assembly to join together said first and second third-level component holder assemblies.

* * * * *